United States Patent
Le et al.

(10) Patent No.: US 12,408,560 B2
(45) Date of Patent: *Sep. 2, 2025

(54) BUFFER LAYERS AND INTERLAYERS THAT PROMOTE BiSbx (012) ALLOY ORIENTATION FOR SOT AND MRAM DEVICES

(71) Applicant: Western Digital Technologies, Inc., San Jose, CA (US)

(72) Inventors: Quang Le, San Jose, CA (US); Brian R. York, San Jose, CA (US); Cherngye Hwang, San Jose, CA (US); Susumu Okamura, San Jose, CA (US); Michael A. Gribelyuk, San Jose, CA (US); Xiaoyong Liu, San Jose, CA (US); Kuok San Ho, Emerald Hills, CA (US); Hisashi Takano, Fujisawa (JP)

(73) Assignee: Western Digital Technologies, Inc., San Jose, CA (US)

( * ) Notice: Subject to any disclaimer, the term of this patent is extended or adjusted under 35 U.S.C. 154(b) by 70 days.

This patent is subject to a terminal disclaimer.

(21) Appl. No.: 18/232,256

(22) Filed: Aug. 9, 2023

(65) Prior Publication Data
US 2023/0386721 A1    Nov. 30, 2023

Related U.S. Application Data

(63) Continuation of application No. 17/401,856, filed on Aug. 13, 2021, now Pat. No. 11,763,973.

(51) Int. Cl.
*H10N 50/10* (2023.01)
*G11B 5/127* (2006.01)
(Continued)

(52) U.S. Cl.
CPC ............ *H10N 50/10* (2023.02); *G11B 5/1278* (2013.01); *G11B 5/235* (2013.01); *G11B 5/314* (2013.01);
(Continued)

(58) Field of Classification Search
None
See application file for complete search history.

(56) References Cited

U.S. PATENT DOCUMENTS 5,751,521 A    5/1998   Gill
6,657,823 B2   12/2003  Kawato
(Continued)

FOREIGN PATENT DOCUMENTS

CN    111354392 A    6/2020
JP    4934582 B2     5/2012
(Continued)

OTHER PUBLICATIONS

Nakano, S., et al., "Improved thermal stability of BiSb pure spin current source for embedded MRAM", the Japan Society of Applied Physics, 2020, vol. 67, p. 14 p-A 501-5.
(Continued)

Primary Examiner — Craig A. Renner
(74) Attorney, Agent, or Firm — Patterson + Sheridan, LLP

(57) ABSTRACT

The present disclosure generally relate to spin-orbit torque (SOT) magnetic tunnel junction (MTJ) devices comprising a buffer layer, a bismuth antimony (BiSb) layer having a (012) orientation disposed on the buffer layer, and an interlayer disposed on the BiSb layer. The buffer layer and the interlayer may each independently be a single layer of material or a multilayer of material. The buffer layer and the interlayer each comprise at least one of a covalently bonded amorphous material, a tetragonal (001) material, a tetragonal
(Continued)

(110) material, a body-centered cubic (bcc) (100) material, a face-centered cubic (fcc) (100) material, a textured bcc (100) material, a textured fcc (100) material, a textured (100) material, or an amorphous metallic material. The buffer layer and the interlayer inhibit antimony (Sb) migration within the BiSb layer and enhance uniformity of the BiSb layer while further promoting the (012) orientation of the BiSb layer.

24 Claims, 13 Drawing Sheets

(51) Int. Cl.
　　*G11B 5/235*　　(2006.01)
　　*G11B 5/31*　　(2006.01)
　　*G11B 5/39*　　(2006.01)
　　*H01F 10/30*　　(2006.01)
　　*H01F 10/32*　　(2006.01)
　　*H10N 52/80*　　(2023.01)
　　*G11B 5/00*　　(2006.01)
(52) U.S. Cl.
　　CPC ........... *G11B 5/3909* (2013.01); *H01F 10/30* (2013.01); *H01F 10/3254* (2013.01); *H01F 10/329* (2013.01); *H10N 52/80* (2023.02); *G11B 2005/0024* (2013.01)

(56) References Cited

U.S. PATENT DOCUMENTS

| | | |
|---|---|---|
| 6,667,861 B2 | 12/2003 | Gill |
| 6,680,828 B2 | 1/2004 | Gill |
| 6,906,898 B2 | 6/2005 | Kawato |
| 7,016,160 B2 | 3/2006 | Mao et al. |
| 7,242,556 B2 | 7/2007 | Gill |
| 7,298,595 B2 | 11/2007 | Gill |
| 7,436,632 B2 | 10/2008 | Li et al. |
| 7,643,255 B2 | 1/2010 | Gill |
| 7,697,242 B2 | 4/2010 | Gill |
| 7,881,018 B2 | 2/2011 | Gill et al. |
| 8,125,746 B2 | 2/2012 | Dimitrov et al. |
| 8,174,799 B2 | 5/2012 | Hoshiya et al. |
| 8,223,464 B2 | 7/2012 | Yasui et al. |
| 8,553,346 B2 | 10/2013 | Braganca et al. |
| 8,570,677 B2 | 10/2013 | Braganca et al. |
| 8,570,689 B2 | 10/2013 | Sato et al. |
| 8,654,465 B2 | 2/2014 | Braganca et al. |
| 9,472,216 B1 | 10/2016 | Mauri et al. |
| 9,806,710 B2 | 10/2017 | Flatté |
| 9,929,210 B2 | 3/2018 | Lai et al. |
| 9,947,347 B1 | 4/2018 | Van Der Heijden et al. |
| 10,014,012 B1 | 7/2018 | Song et al. |
| 10,127,933 B2 | 11/2018 | Batra et al. |
| 10,210,888 B1 | 2/2019 | Li et al. |
| 10,483,457 B1 | 11/2019 | Lee et al. |
| 10,490,731 B2 | 11/2019 | Sasaki et al. |
| 10,559,747 B1 | 2/2020 | Li et al. |
| 10,720,570 B2 | 7/2020 | Le et al. |
| 10,839,831 B1 | 11/2020 | Nguyen et al. |
| 10,867,626 B1 | 12/2020 | Li et al. |
| 10,991,390 B2 | 4/2021 | Kobayashi |
| 11,088,200 B1 | 8/2021 | Xiao |
| 11,094,338 B1 | 8/2021 | Hwang et al. |
| 11,100,946 B1 | 8/2021 | Le et al. |
| 11,222,656 B1 | 1/2022 | Le et al. |
| 11,495,741 B2 | 11/2022 | York et al. |
| 11,532,323 B1 | 12/2022 | Le et al. |
| 11,763,973 B2 * | 9/2023 | Le et al. ............ G11B 5/3909 360/324.2 |
| 2011/0089940 A1 | 4/2011 | Carey et al. |
| 2014/0226239 A1 | 8/2014 | Mihajlovic et al. |
| 2014/0254252 A1 | 9/2014 | Guo |
| 2015/0041934 A1 | 2/2015 | Khvalkovskiy et al. |
| 2015/0287426 A1 | 10/2015 | Mihajlovic et al. |
| 2017/0077392 A1 | 3/2017 | Han et al. |
| 2017/0098545 A1 | 4/2017 | Woodruff |
| 2017/0221506 A1 | 8/2017 | Tan et al. |
| 2017/0271581 A1 | 9/2017 | Seong et al. |
| 2017/0288666 A1 | 10/2017 | Flatté |
| 2017/0365777 A1 | 12/2017 | Mihajlovic et al. |
| 2018/0166500 A1 | 6/2018 | Wang et al. |
| 2018/0358543 A1 | 12/2018 | Le et al. |
| 2018/0366172 A1 | 12/2018 | Wang et al. |
| 2019/0037703 A1 | 1/2019 | Wang et al. |
| 2019/0058113 A1 | 2/2019 | Ramaswamy et al. |
| 2019/0326353 A1 | 10/2019 | O'Brien et al. |
| 2019/0392881 A1 | 12/2019 | Rakshit et al. |
| 2020/0035910 A1 | 1/2020 | Li et al. |
| 2020/0098410 A1 | 3/2020 | Gosavi et al. |
| 2020/0176511 A1 | 6/2020 | Park et al. |
| 2020/0243603 A1 | 7/2020 | Lee et al. |
| 2020/0243752 A1 | 7/2020 | Sasaki |
| 2020/0279992 A1 | 9/2020 | Pham et al. |
| 2021/0056988 A1 | 2/2021 | Chen et al. |
| 2021/0104344 A1 | 4/2021 | Nguyen et al. |
| 2021/0249038 A1 | 8/2021 | Le et al. |
| 2021/0328134 A1 | 10/2021 | Guo et al. |
| 2021/0336127 A1 | 10/2021 | Le et al. |
| 2021/0351342 A1 | 11/2021 | Yui et al. |
| 2021/0367142 A1 | 11/2021 | Lee et al. |
| 2021/0408370 A1 | 12/2021 | York et al. |
| 2022/0005498 A1 | 1/2022 | Le et al. |
| 2022/0013138 A1 | 1/2022 | Hwang et al. |
| 2022/0029090 A1 | 1/2022 | Cho et al. |
| 2022/0044103 A1 | 2/2022 | Nguyen et al. |
| 2022/0068538 A1 | 3/2022 | Apalkov et al. |
| 2022/0069202 A1 | 3/2022 | Nguyen et al. |
| 2023/0027086 A1 | 1/2023 | Le et al. |
| 2023/0047223 A1 | 2/2023 | Le et al. |

FOREIGN PATENT DOCUMENTS

| | | |
|---|---|---|
| JP | 2021034480 A | 3/2021 |
| JP | 2021057357 A | 4/2021 |
| JP | 2021128814 A | 9/2021 |
| WO | 2018231292 A1 | 12/2018 |
| WO | 2019054484 A1 | 3/2019 |
| WO | 2019125388 A1 | 6/2019 |
| WO | 2019159885 A1 | 8/2019 |
| WO | 2020179493 A1 | 9/2020 |
| WO | 2023022764 A1 | 2/2023 |

OTHER PUBLICATIONS

Khang et al. "A conductive topological insulator with large spin Hall effect for ultralow power spin-orbit torque switching," Nature Materials, vol. 17, pp. 808-813, Sep. 2018, pp. 808-813, https://doi.org/10.1038/s41563-018-0137-y.

Roschewsky et al. "Spin-orbit torque and Nernst effect in Bi—Sb/Co heterostructures," Physical Review, vol. B 99, No. 195103, 2019, pp. 195103-1-195103-5, DOI: 10.1103/PhysRevB.99.195103.

Walker et al. "Composition-dependent structural transition in epitaxial Bi1—xSbx thin films on Si (111)," Physical Review Materials, vol. 3, 064201, Jun. 7, 2019, 8 pages.

Eustathopoulos "Wetting by Liquid Metals-Application in Materials Processing: The Contribution of the Grenoble Group," Metals, 2015, vol. 5, No. 1, pp. 350-370, doi:10.3390/met5010350.

Frolov et al. "Structural phase transformations in metallic grain boundaries," Nature Communications, 2013, vol. 4, No. 1899, pp. 1-7, DOI: 10.1038/ncomms2919.

Berry et al. "Melting at dislocations and grain boundaries: A phase field crystal study," Physical Review, vol. B 77, No. 224114, 2008, pp. 224114-1-224114-5, DOI: 10.1103/PhysRevB.77.224114.

Kogtenkova et al. "Grain Boundary Complexions and Phase Transformations in Al- and Cu-Based Alloys," Metals, 2019, vol. 9, No. 1, doi:10.3390/met9010010, 24 pages.

(56) References Cited

OTHER PUBLICATIONS

Buffat et al. "Size effect on the melting temperature of gold particles," Physical Review A, vol. 13, No. 6, Jun. 1976, pp. 2287-2298.
Cantwell et al. "Grain boundary complexions," ScienceDirect, Acta Materialia, vol. 62, No. 152, 2014, pp. 1-48, http://dx.doi.org/10.1016/j.actamat.2013.07.037.
Tanaka et al. "Thermodynamic Evaluation of Nano-Particle Binary Alloy Phase Diagrams," 2001, Zeitschrift für Metallkunde, vol. 92, No. 11, pp. 1236-1241, http: //hdl.handle.net/11094/26514.
Chi et al. "The Spin Hall Effect of Bi—Sb Alloys Driven by Thermally Excited Dirac-like Electronics," Oct. 28, 2019, ArXiv:1910, 40 pages, https://arxiv.org/pdf/1910.12433.pdf.
Shirokura et al. "Origin of the Giant Spin Hall Effect in BISb Topological Insulator," ArXiv:1810; 27 pages, https://arxiv.org/ftp/arxiv/papers/1810/1810.10840.pdf, 2018.
Shao "Spin-Orbit Torques in Topological Insultators," UCLA Electronic Theses and Dissertations; 2015; 76 pages, https://escholarship.org/content/qt3ds9792s/qt3ds9792s.pdf?t=nys1b5&nosplash=32ac004cc5750a361e60ece735dd2752.
Yao et al. "Influence of Crystal Orientation and Surface Termination on the Growth of BiSb thin films on GaAs Substrates," Accepted Manuscript, Journal of Crystal Growth, 2019, 24 pages, doi: https://doi.org/10.1016/j.crysgro.2019.01.041.
International Search Report and the Written Opinion for International Application No. PCT/US2020/065156 mailed Mar. 14, 2021, 13 pages.
International Search Report and the Written Opinion for International Application No. PCT/US2020/066902 mailed Apr. 18, 2021, 12 pages.
Fan et al. "Magnetization switching through giant spin-orbit torque in a magnetically doped topological insulator heterostructure," Nature Materials, vol. 13, Apr. 28, 2014, pp. 669-704, <<https://doi.org/10.1038/nmat3973>>.
Roschewsky et al. "Spin-Orbit Torque and Nernst Effect in BiSb/ Co Heterostructures," Center for Energy Efficient Electronics Science, University of California—Berkeley, 2018, 12 pages, https://e3s-center.berkeley.edu/wp-content/uploads/2018/11/43Theme-4_Roschewsky_2018E3Sretreat.pdf, 5 pages.
U.S. Appl. No. 17/401,856, filed Aug. 13, 2021.
U.S. Appl. No. 17/405,954, filed Aug. 18, 2021.
Teague "X-ray and Mossbauer spectroscopy studies of the silicon-antimony and bismuth-antimony alloys," 1971, Scholar's Mine, Doctoral Dissertations, University of Missouri-Rolla, 167 pages.

"A colossal breakthrough for topological spintronics," Tokyo Institute of Technology, Jul. 31, 2018, 4 pages, <https://www.titech.ac.jp/english/news/2018/042001.html>.
International Search Report and the Written Opinion for International Application No. PCT/US2021/033912 mailed Jul. 25, 2021, 9 pages.
Lau et al. "Spin-orbit torque switching without an external field using interlayer exchange coupling," Nature Nanotechnology, vol. 11, Sep. 2016, pp. 758-762, <https://doi.org/10.1038/nnano.2016.84>.
Liu "Spin-orbit Torque Driven Magnetization Switching for Nonvolatile Memory and Beyond," Carnegie Mellon University, May 2020, Thesis, 157 pages, <https://doi.org/10.1184/R1/11933571.v1>, <https://kilthub.cmu.edu/articles/Spinorbit_Torque_Driven_Magnetization_Switching_for_Nonvolatile_Memory_and_Beyond/11933571/files/21908046.pdf>.
Han et al. "Self-Biased Differential Dual Spin Valve Readers for Future Magnetic Recording," IEEE Transactions on Magnetics, vol. 48, No. 5, May 2012, pp. 1770-1776, 10.1109/TMAG.2011.2169946.
International Search Report and the Written Opinion for International Application No. PCT/US2021/033197 mailed Jul. 12, 2021, 9 pages.
Jabeur et al. "Study of spin transfer torque (STT) and spin orbit torque (SOT) magnetic tunnel junctions (MTJs) at advanced CMOS technology nodes," Electrical and Electronics Engineering: An International Journal, (ELELIJ) vol. 6, No. 1, Feb. 2017, pp. 1-9, 10.14810/elelij.2017.6101.
Yuan et al. "Readback Resolution of Differential Dual CPP Spin Valve Reader," IEEE Transactions on Magnetics, vol. 16, No. 6, Jun. 2010, pp. 1667-1670, 10.1109/TMAG.2010.2045106.
Tuo Fan et al. "Ultrahigh Efficient Spin-Orbit Torque Magnetization Switching in All-Sputtered Topological Insulator—Ferromagnet Multilayer", Jul. 5, 2020, <https://arxiv.org/ftp/arxiv/papers/2007/2007.02264.pdf.
International Search Report and Written Opinion for International Application No. PCT/US2022/027960 dated Sep. 5, 2022.
Zhang et al., "Different types of spin currents in the comprehensive materials database of nonmagnetic spin Hall effect", NPJ Computational Materials, 2021, 167, pp. 1-7, (Year: 2021).
Shirokura et al. "Origin of the Giant Spin Hall Effect in BISb Topological Insulator," ArXiv:1810; 27 pages, https://arxiv.org/ftp/arxiv/papers/1810/1810.10840.pdf, Published Oct. 25, 2018.

* cited by examiner

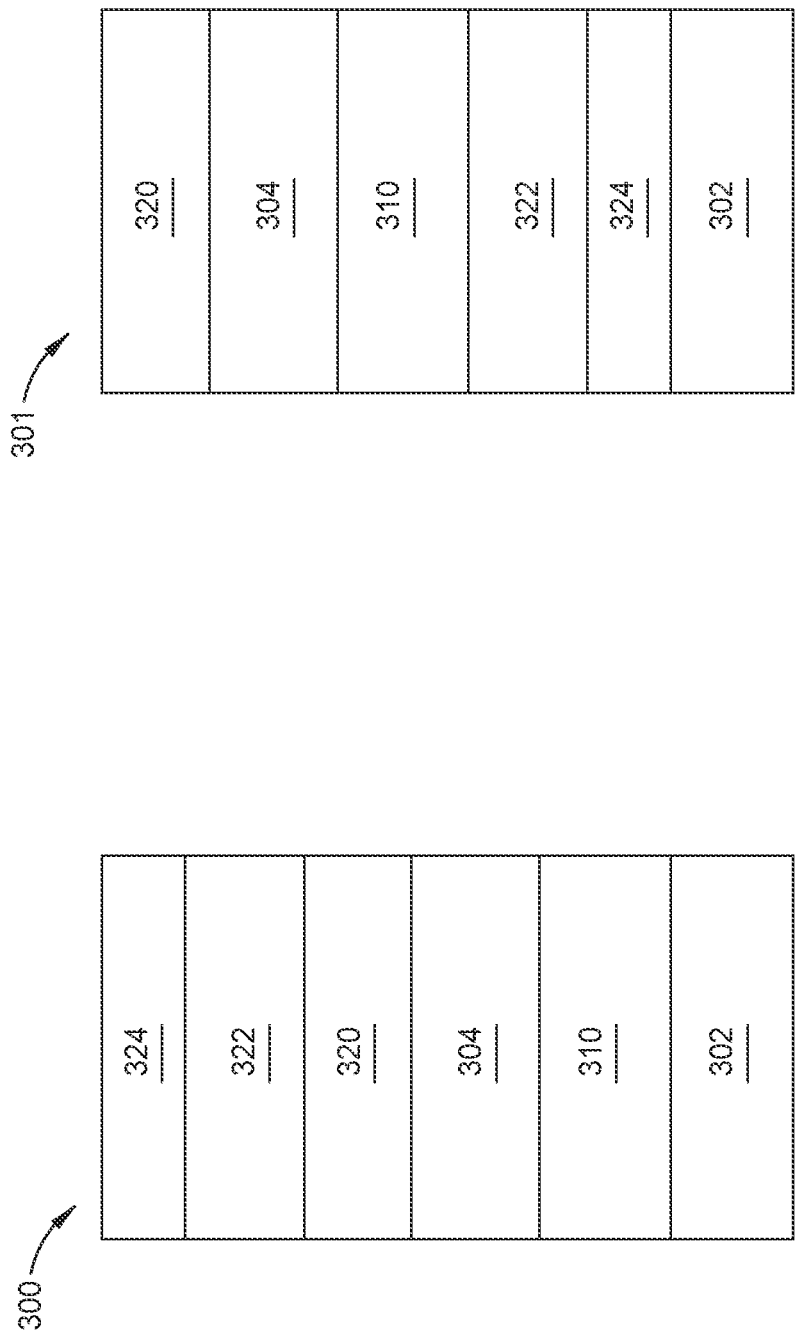

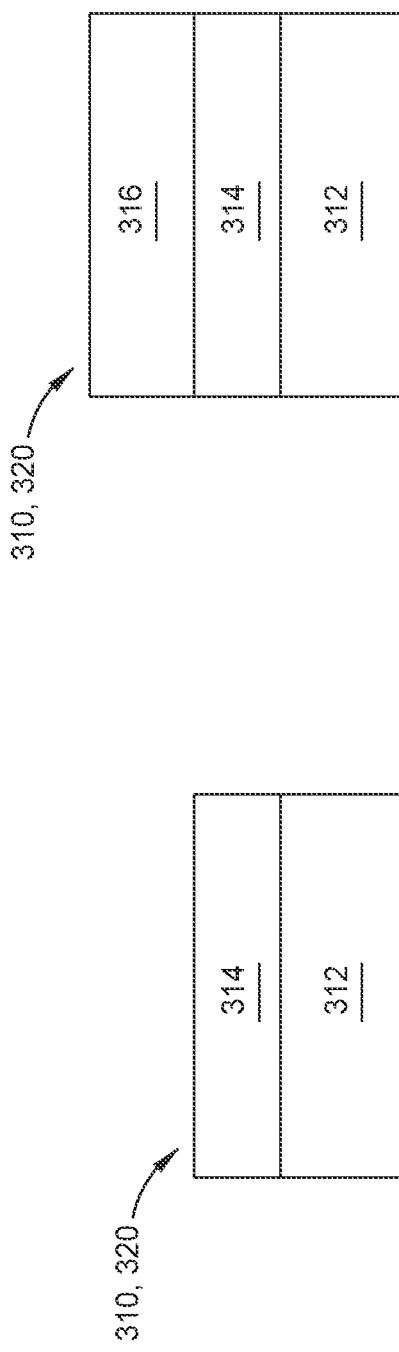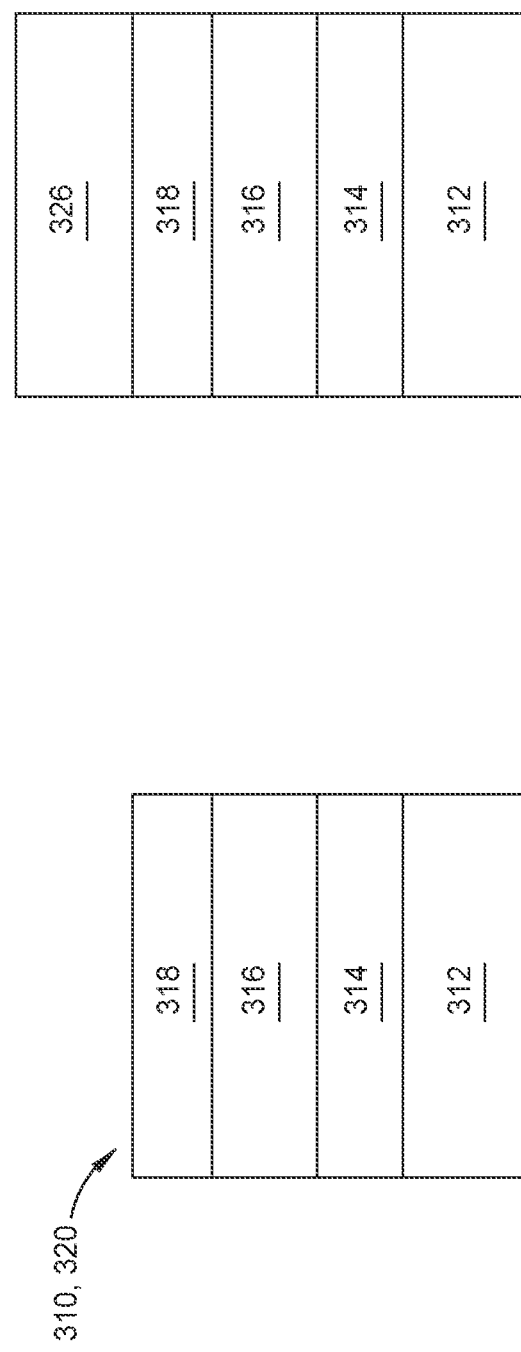

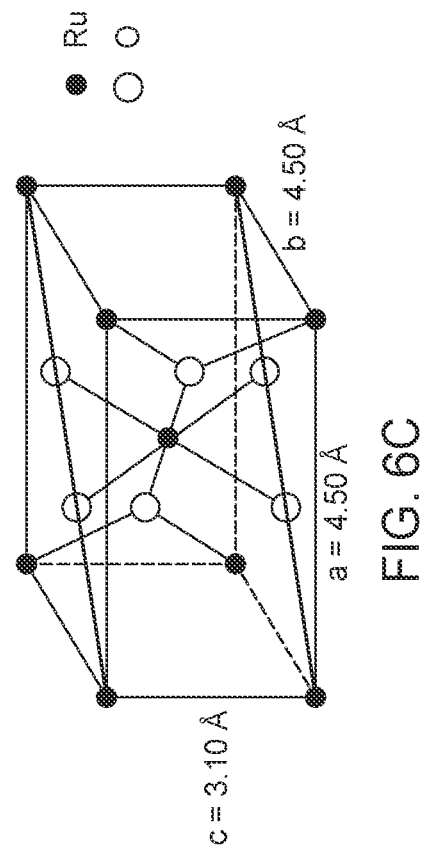
FIG. 6B
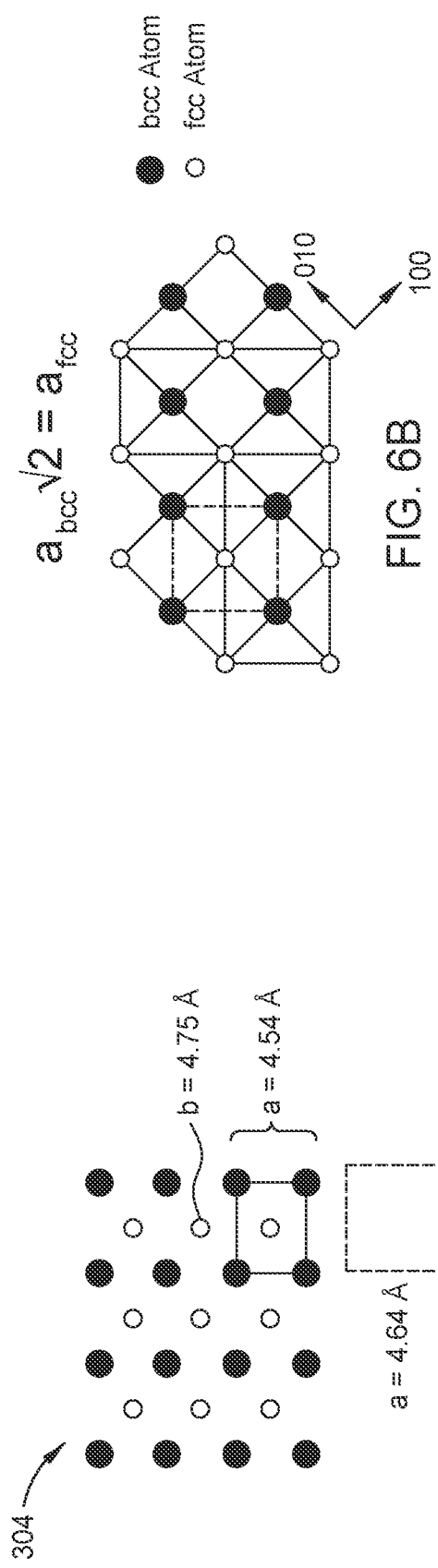
FIG. 6A
FIG. 6C

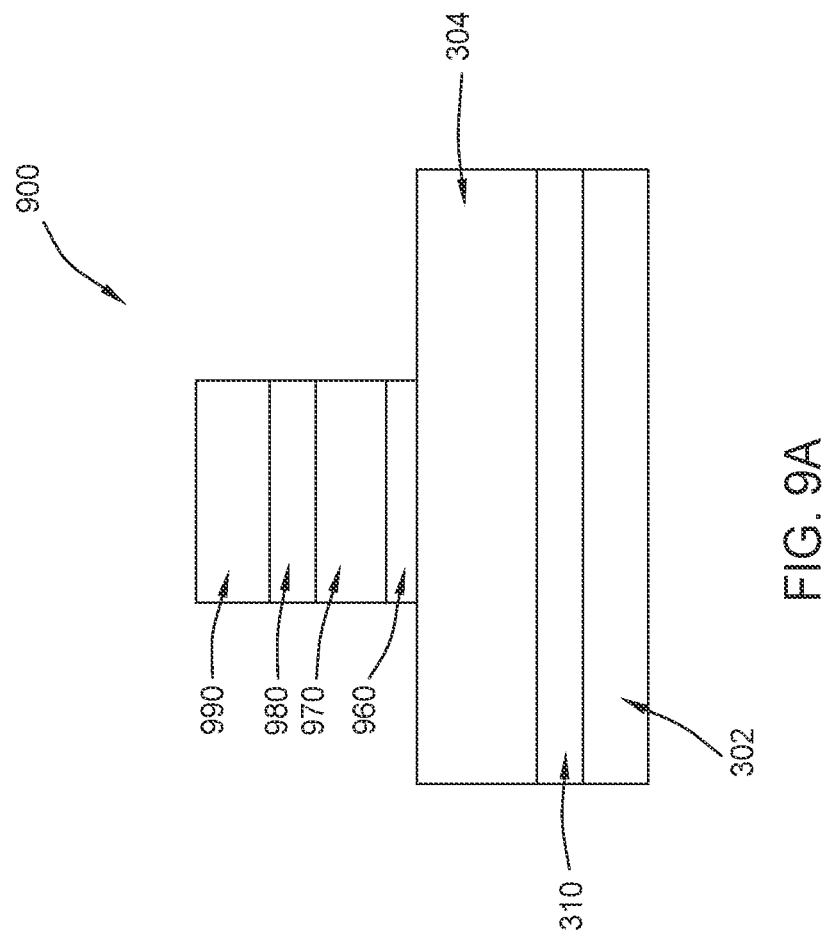

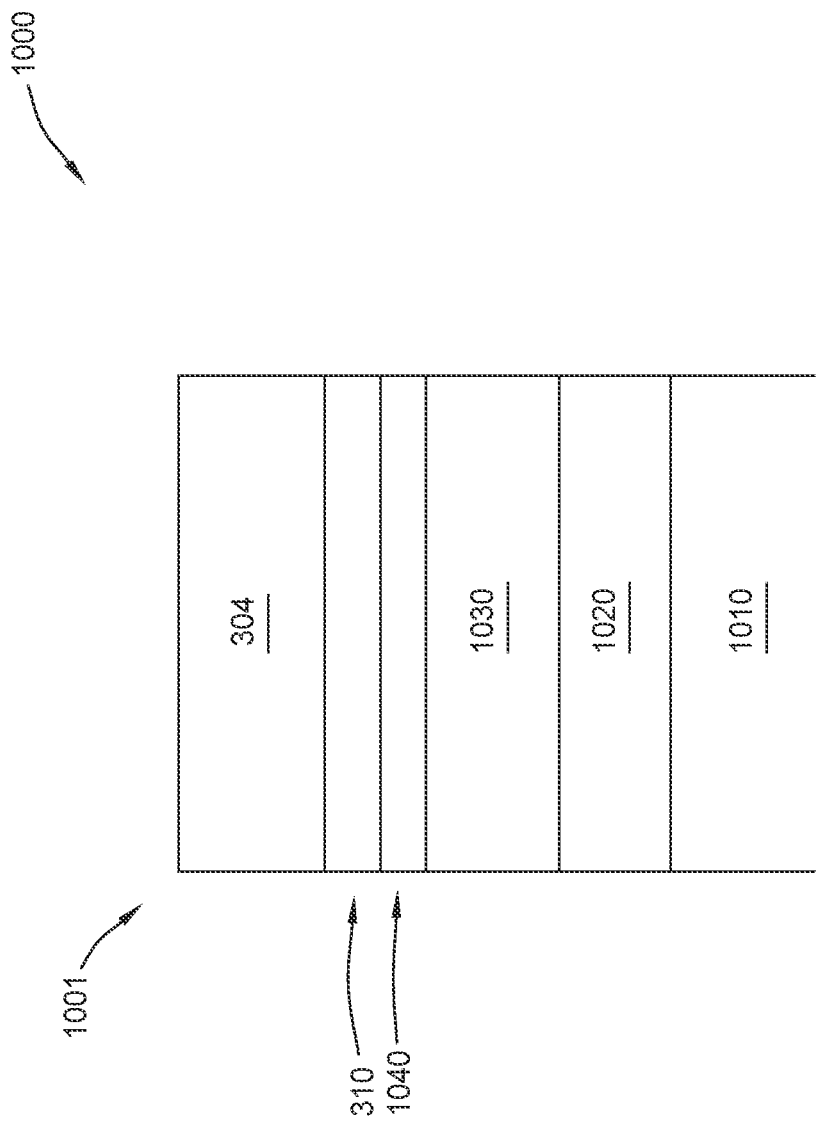

BUFFER LAYERS AND INTERLAYERS THAT PROMOTE BiSbx (012) ALLOY ORIENTATION FOR SOT AND MRAM DEVICES

CROSS-REFERENCE TO RELATED APPLICATIONS

This application is a continuation of co-pending U.S. patent application Ser. No. 17/401,856, filed Aug. 13, 2021, which is herein incorporated by reference.

BACKGROUND OF THE DISCLOSURE

Field of the Disclosure

Embodiments of the present disclosure generally relate to a buffer layer and an interlayer that inhibit antimony (Sb) migration within a bismuth antimony (BiSb) layer having a (012) orientation.

Description of the Related Art

BiSb is a material that has been proposed as a spin Hall layer for spin torque oscillator (STO) and magnetoresistive random access memory (MRAM) devices. BiSb is a narrow gap topological insulator with both giant spin Hall effect and high electrical conductivity.

N. H. D. Khang, Y. Ueda, and P. N. Hai, "A conductive topological insulator with large spin Hall effect for ultralow power spin-orbit torque switching," *Nature Materials*, v. 17, 808 (2018), discovered that BiSb with a (012) crystallographic orientation has a high spin Hall angle and high conductivity in comparison to BiSb with a (001) crystallographic orientation. BiSb with a (012) crystallographic orientation was formed on a MnGa film with a (001) crystallographic orientation which was formed on a GaAs substrate with a (001) crystallographic orientation.

N. Roschewsky, E. S. Walker, P. Gowtham, S. Muschinske, F. Hellman, S. R. Bank, and S. Salahuddin, "Spin-orbit torque and Nernst effect in Bi—Sb/Co heterostructures", *Phys. Rev. B*, vol. 99, 195103 (2 May 2019), recognized that BiSb growth, crystallographic orientation, spin Hall angle, and high conductivity had poor consistency among experiments.

E. S. Walker, S. Muschinske, C. J. Brennan, S. R. Na, T. Trivedi, S. D. March, Y. Sun, T. Yang, A. Yau, D. Jung, A. F. Briggs, E. M. Krivoy, M. L. Lee, K. M. Liechti, E. T. Yu, D. Akinwande, and S. R. Bank, "Composition-dependent structural transition in epitaxial Bi1-xSbx thin films on Si(111)", *Phys. Rev. Materials* 3, 064201 (7 Jun. 2019), established growing Bi1-xSbx thin films at any thickness (including very ultra-thin films) on Si(111) substrates but only for concentrations in the 9% to 28% Sb concentration range, which happen to overlap the range needed to exhibit TI (Topological Insulator) properties. Furthermore, ultrathin <20 Å Bi films could be grown with a strong (012) orientation, suggesting ultra-thin Bi/BiSb film laminates could be grown epitaxially with strong (012) orientation.

FIG. 11 illustrates a TEM-EELS line scan of relative Sb concentration in a 100 Å thick BiSb layer within a SOT stack without proper adjacent buffer and interlayers. FIG. 11 shows the problem of Sb migration to the interfaces from the bulk which could be improved with the use of ultra-thin Bi layers of thickness t, 0<t<10 Å, sandwiching BiSb SOT layers that can serve as Sb composition modulations layers, to help improve the chemical uniformity and maintain (012) texture and structure of the BiSb layer degraded by Sb migration. However, both thin Bi and BiSb film adhesion of the BiSb layer with a (012) orientation on Si (111) was poor.

Therefore, there is a need for an improved process to form BiSb with high spin Hall angle and high conductivity and for improved devices having a BiSb layer with high spin Hall angle and high conductivity.

SUMMARY OF THE DISCLOSURE

The present disclosure generally relate to spin-orbit torque (SOT) magnetic tunnel junction (MTJ) devices comprising a buffer layer, a bismuth antimony (BiSb) layer having a (012) orientation disposed on the buffer layer, and an interlayer disposed on the BiSb layer. The buffer layer and the interlayer may each independently be a single layer of material or a multilayer of material. The buffer layer and the interlayer each comprise at least one of a covalently bonded amorphous material, a tetragonal (001) material, a tetragonal (110) material, a body-centered cubic (bcc) (100) material, a face-centered cubic (fcc) (100) material, a textured bcc (100) material, a textured fcc (100) material, a textured (100) material, or an amorphous metallic material. The buffer layer and the interlayer inhibit antimony (Sb) migration within the BiSb layer and enhance uniformity of the BiSb layer while further promoting the (012) orientation of the BiSb layer.

In one embodiment, a spin-orbit torque (SOT) magnetic tunnel junction (MTJ) device comprises a substrate, a buffer layer formed over the substrate, the buffer layer comprising: an amorphous layer comprising a material in an amorphous structure, wherein the material comprises a covalently bonded carbide, a covalently bonded oxide, or a covalently bonded nitride, and a bismuth antimony (BiSb) layer formed over the buffer layer, the BiSb layer having a (012) orientation, wherein the buffer layer is configured to reduce migration of Sb in the BiSb layer.

In another embodiment, a SOT MTJ device comprises a substrate, a buffer layer formed on the substrate, the buffer layer comprising: at least one first intermediary layer, the at least one first intermediary layer comprising at least one of: a tetragonal (001) material, a tetragonal (110) material, a body-centered cubic (bcc) (100) material, a face-centered cubic (fcc) (100) material, a textured bcc (100) material, a textured fcc (100) material, a textured (100) material, or an amorphous material comprising a covalently bonded carbide, a covalently bonded oxide, or a covalently bonded nitride, and a bismuth antimony (BiSb) layer stack formed over the buffer layer comprising a BiSb layer having a (012) orientation, wherein the BiSb layer stack further comprises: a first Bi layer, wherein the BiSb layer is disposed on the first Bi layer, and a second Bi layer disposed on the BiSb layer, wherein the first and second Bi layers: each has a thickness greater than about 0 Å and less than about 10 Å, and sandwich the BiSb layer to promote a (012) BiSb texture and serve as Sb composition modulations layers configured to improve a chemical uniformity and structure of the BiSb layer degraded by Sb migration.

In yet another embodiment, a SOT MTJ device comprises a substrate and a buffer layer formed over the substrate, the buffer layer comprising: a textured layer with a (100) orientation and a first intermediary layer disposed over the textured layer, the first intermediary layer comprising at least one of a cubic crystal structure selected from the group consisting of tetragonal (001), tetragonal (110), body-centered cubic (bcc) (100), face-centered cubic (fcc) (100), textured bcc (100), and textured fcc (100). The SOT MTJ device further comprises a bismuth antimony (BiSb) layer formed over the buffer layer, the BiSb layer having a (012) orientation, wherein the buffer layer is configured to reduce diffusion of Sb in the BiSb layer, and an interlayer disposed on the BiSb layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A-3B illustrate spin-orbit torque (SOT) magnetic tunnel junction (MTJ) devices, according to various embodiments.

FIGS. 4A-4D illustrate exemplary multilayer structures of the buffer layer and/or the interlayer that may be utilized with the SOT MTJ devices of FIGS. 3A-3B, according to various embodiments.

FIGS. 6A-6E are schematic views illustrating atom lattice structures of layers within the SOT MTJ devices of FIGS. 3A-3B, according to various embodiments.

FIGS. 7-8 are graphs of a textured layer of 30 Å of RuAl in a B2 phase that is disposed on an amorphous layer of 30 Å of NiFeTa, in which a (100) fcc textured layer (MgO), a (100) bcc textured layers (Cr, Ta, W, W/Ta), and (100) B2 texture layer (NiAl) are grown on.

FIG. 9A is a schematic cross-sectional view of a SOT device for use in a MAMR write head, such as the MAMR write head of the drive of FIG. 1 or other suitable magnetic media drives.

FIG. 10 is a schematic cross-sectional view of a SOT MTJ used as a MRAM device.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
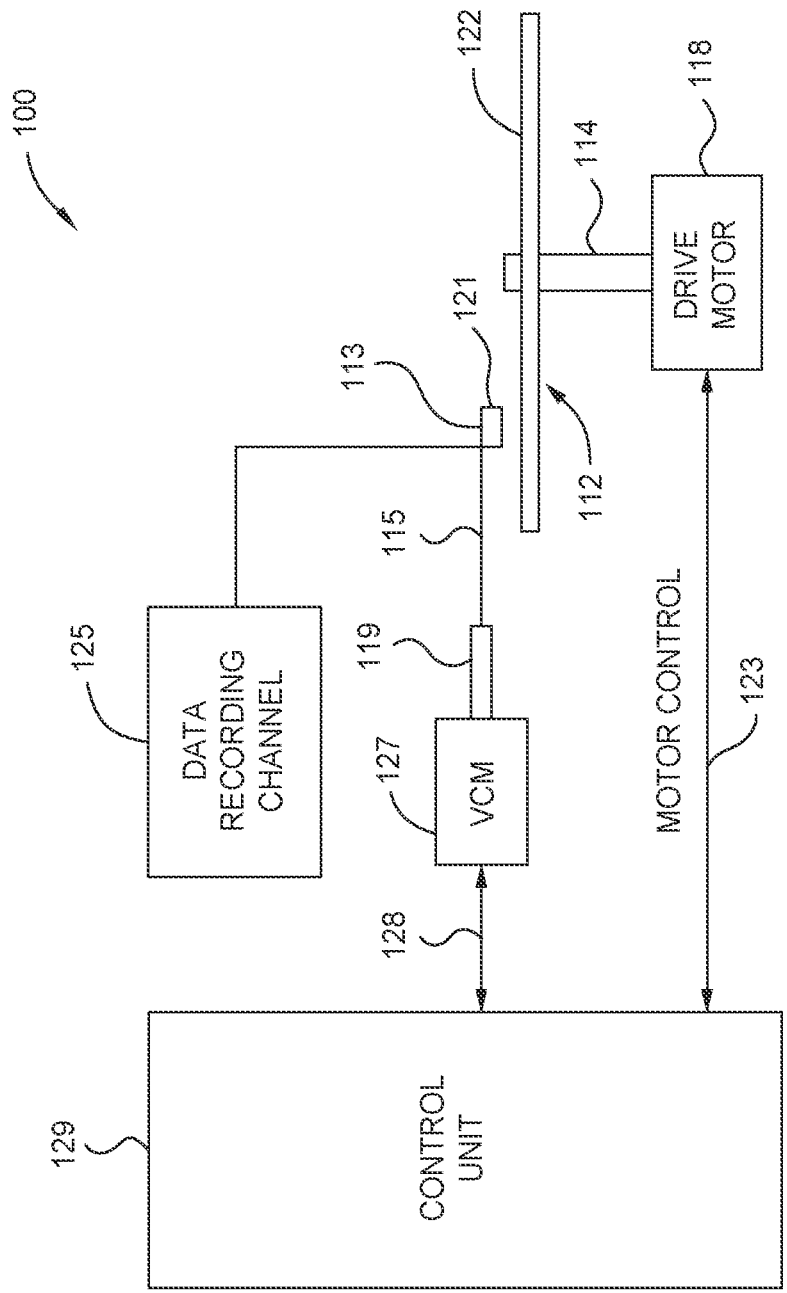
FIG. 1 is a schematic illustration of certain embodiments of a magnetic media drive including a MAMR write head having a SOT MTJ device.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relate to spin-orbit torque (SOT) magnetic tunnel junction (MTJ) devices comprising a buffer layer, a bismuth antimony (BiSb) layer having a (012) orientation disposed on the buffer layer, and an interlayer disposed on the BiSb layer. The buffer layer and the interlayer may each independently be a single layer of material or a multilayer of material. The buffer layer and the interlayer each comprise at least one of a covalently bonded amorphous material, a tetragonal (001) material, a tetragonal (110) material, a body-centered cubic (bcc) (100) material, a face-centered cubic (fcc) (100) material, a textured bcc (100) material, a textured fcc (100) material, a textured (100) material, or an amorphous metallic material. The buffer layer and the interlayer inhibit antimony (Sb) migration within the BiSb layer and enhance uniformity of the BiSb layer while further promoting the (012) orientation of the BiSb layer.

Embodiments of the present disclosure generally relate to a buffer layer that promotes preservation of a bismuth antimony (BiSb) layer having a (012) orientation. Antimony (Sb) is highly reactive, and the buffer layer provides a low-reactive medium that reduces chemical interaction between the BiSb layer and external materials while promoting the growth of the BiSb in a (012) orientation. The configuration of the buffer layer reduces the migration of Sb in the BiSb layer.

A BiSb layer having a (012) orientation has a large spin Hall angle effect and high electrical conductivity. A BiSb layer having a (012) orientation can be used to form a spin-orbit torque (SOT) magnetic tunnel junction (MTJ) device. For example, a BiSb layer having a (012) orientation can be used as a spin Hall layer in a spin-orbit torque device in a magnetic recording head, e.g., as part of a read head, and/or a microwave assisted magnetic recording (MAMR) write head. In another example, a BiSb layer having a (012) orientation can be used as a spin Hall electrode layer in a magnetoresistive random access memory (MRAM) device. The SOT MTJ device can be in a perpendicular stack configuration or an in-plane stack configuration. The SOT MTJ device can be utilized in, for example, MAMR writing heads, in MRAM, in artificial intelligence chips, and in other applications. A BiSb layer stack 304 with a (012) orientation has a higher spin Hall angle and higher performance in a SOT MTJ device than a BiSb layer with a (001) orientation.

FIG. 1 is a schematic illustration of certain embodiments of a magnetic media drive 100 including a MAMR write head having a SOT MTJ device. Such a magnetic media drive may be a single drive or comprise multiple drives. For the sake of illustration, a single disk drive 100 is shown according to certain embodiments. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

Figure 2:
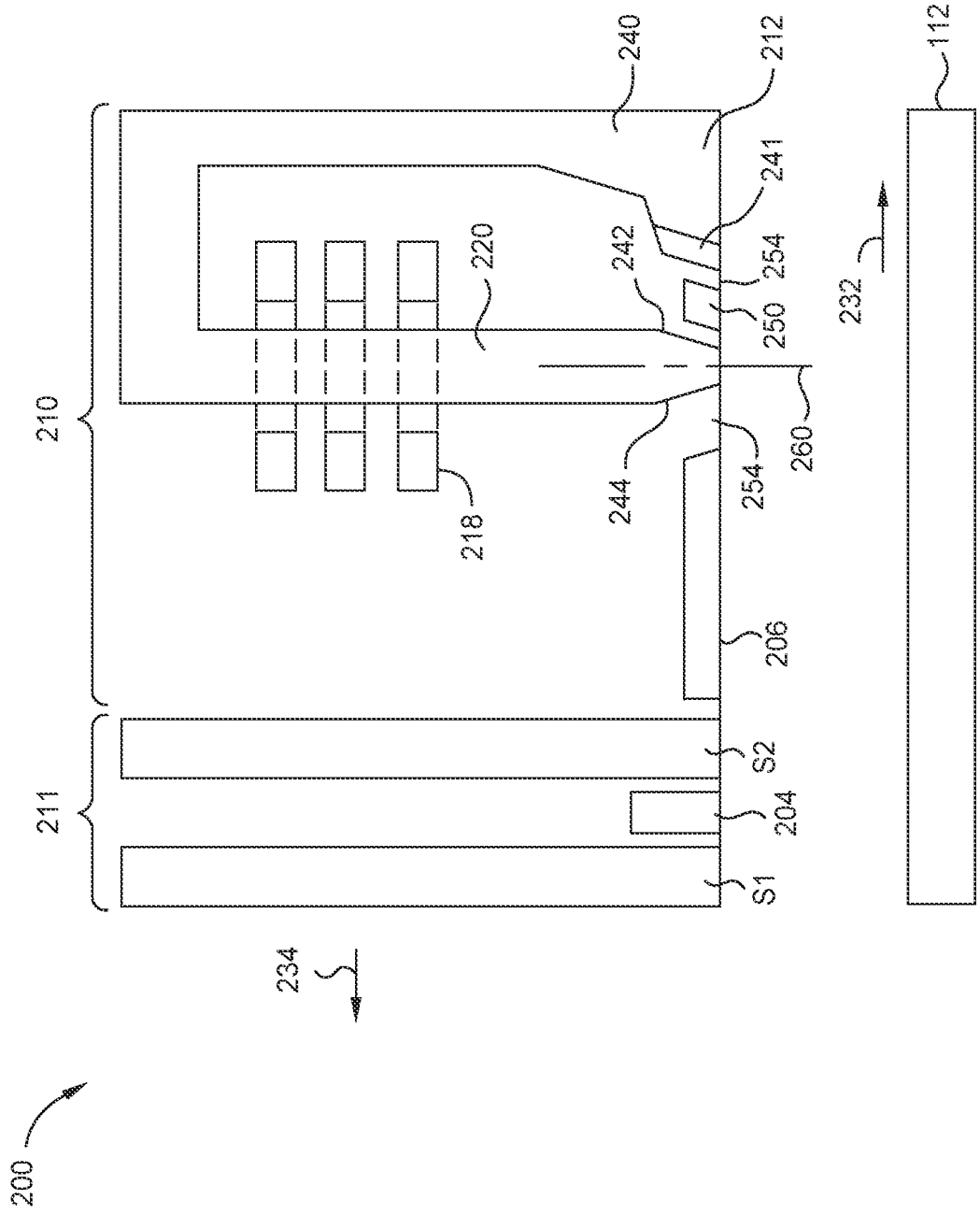
FIG. 2 is a fragmented, cross-sectional side view of certain embodiments of a read/write head having a SOT MTJ device.

At least one slider 113 is positioned near the magnetic disk 112, each slider 113 supporting one or more magnetic head assemblies 121 that include a SOT device. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 2 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a typical magnetic media drive and the accompanying illustration of FIG. 1 are for representation purposes only. It should be apparent that magnetic media drives may contain a large number of media, or disks, and actuators, and each actuator may support a number of sliders.

FIG. 2 is a fragmented, cross-sectional side view of certain embodiments of a read/write head 200 having a SOT MTJ device. The read/write head 200 faces a magnetic media 112. The read/write head 200 may correspond to the magnetic head assembly 121 described in FIG. 1. The read/write head 200 includes a media facing surface (MFS) 212, such as a gas bearing surface, facing the disk 112, a MAMR write head 210, and a magnetic read head 211. As shown in FIG. 2, the magnetic media 112 moves past the MAMR write head 210 in the direction indicated by the arrow 232 and the read/write head 200 moves in the direction indicated by the arrow 234.

In some embodiments, the magnetic read head 211 is a magnetoresistive (MR) read head that includes an MR sensing element 204 located between MR shields S1 and S2. In other embodiments, the magnetic read head 211 is a magnetic tunnel junction (MTJ) read head that includes a MTJ sensing device 204 located between MR shields S1 and S2. The magnetic fields of the adjacent magnetized regions in the magnetic disk 112 are detectable by the MR (or MTJ) sensing element 204 as the recorded bits. The SOT MTJ device of various embodiments can be incorporated into the read head 211.

The MAMR write head 210 includes a main pole 220, a leading shield 206, a trailing shield 240, a spin orbital torque (SOT) device 250, and a coil 218 that excites the main pole 220. The coil 218 may have a "pancake" structure which winds around a back-contact between the main pole 220 and the trailing shield 240, instead of a "helical" structure shown in FIG. 2. The SOT device 250 is formed in a gap 254 between the main pole 220 and the trailing shield 240. The main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree of taper, and the degree of taper is measured with respect to a longitudinal axis 260 of the main pole 220. In some embodiments, the main pole 220 does not include the trailing taper 242 and the leading taper 244. Instead, the main pole 220 includes a trailing side (not shown) and a leading side (not shown), and the trailing side and the leading side are substantially parallel. The main pole 220 may be a magnetic material, such as a FeCo alloy. The leading shield 206 and the trailing shield 240 may be a magnetic material, such as a NiFe alloy. In certain embodiments, the trailing shield 240 can include a trailing shield hot seed layer 241. The trailing shield hot seed layer 241 can include a high moment sputter material, such as CoFeN or FeXN, where X includes at least one of Rh, Al, Ta, Zr, and Ti. In certain embodiments, the trailing shield 240 does not include a trailing shield hot seed layer.

FIGS. 3A-3B illustrate spin-orbit torque (SOT) magnetic tunnel junction (MTJ) devices 300, 301, according to various embodiments. The SOT MTJ devices 300, 301 may each individually be used in the MAMR write head of the drive 100 of FIG. 1, the read/write head 200 of FIG. 2, or other suitable magnetic media drives.

FIG. 3A illustrates a SOT MTJ device 300, according to one embodiment. The SOT MTJ device 300 comprises a substrate 302, a buffer layer 310 disposed on the substrate 302, a BiSb layer 304 or BiSb layer stack 304 comprising with a crystal orientation of (012) disposed on the buffer layer 310, an interlayer 320 disposed on the BiSb layer 304, a tunnel magnetoresistance (TMR)-like free layer 322 disposed on the interlayer 320, and a MgO layer 324 disposed on the TMR-like free layer 322. FIG. 3B illustrates a reverse SOT MTJ device 301, according to one embodiment. The SOT MTJ device 301 comprises the substrate 302, a MgO layer 324 disposed on the substrate 302, a TMR-like free layer 322 disposed on the MgO layer 324, the buffer layer 310 disposed on the TMR-like free layer 322, the BiSb layer 304 comprising with a crystal orientation of (012) disposed on the buffer layer 310, and the interlayer 320 disposed on the BiSb layer 304. The SOT MTJ devices 300, 301 comprise the same layers 302, 304, 310, 320, 322, 324 in different arrangements.

The substrate 302 can be a silicon substrate or an alumina substrate. The silicon substrate 302 has a cubic structure of (111), (100), (100), or other crystal orientations. The alumina substrate 302 has a hexagonal structure with (001) orientations or with other crystal orientations or has an amorphous structure. The substrate 302 can be a bare substrate or can have one or more layers formed thereover, such as an oxide layer thermally grown or deposited thereover.

In one embodiment, the interlayer 320 may be the same material as the buffer layer 310. For example, like shown in FIGS. 3A-3B, the interlayer 320 and the buffer layer 310 may each individually comprise a single layer of a crystalline or amorphous material. In another example, the interlayer 320 and the buffer layer 310 may each individually comprise multiple layers of crystalline and/or amorphous materials. In another embodiment, the interlayer 320 and the buffer layer 310 each individually comprise one or more different materials.

The buffer layer 310 and the interlayer 320 may each individually be a multilayer structure, as discussed further below in FIGS. 4A-4D. In one embodiment, the buffer layer 310 and/or the interlayer 320 is a covalently bonded amorphous layer. The covalently bonded amorphous material may comprise one of a covalently bonded carbide, a covalently bonded oxide, or a covalently bonded nitride. The covalently bonded amorphous material has a lattice constant of the crystal structure ($a_{fcc}$) between about 3.5 Å and 3.71 Å, and the covalently bonded amorphous material has a nearest neighbor distance equal to about $a_{fcc}$ divided by the square root of 3. In some configurations, the nearest neighbor distance is between about 2.0 Å to about 2.2 Å.

In some embodiments, the buffer layer 310 and the interlayer 320 each individually comprises one or more highly bonded materials such that the materials are less likely to interact with Sb or Bi in the BiSb layer 304 than ionic chemicals. As further discussed below in FIGS. 4A-4D, the buffer layer 310 and the interlayer 320 may each individually comprise one or more materials selected from the group consisting of: a covalently bonded amorphous material, a tetragonal (001) material, a tetragonal (110) material, a body-centered cubic (bcc) (100) material, a face-centered cubic (fcc) (100) material, a textured bcc (100) material, a textured fcc (100) material, a textured (100) material, an amorphous metallic material, and a layered combination of one or more of any of the preceding materials.

FIGS. 4A-4D illustrate exemplary multilayer structures of the buffer layer 310 and/or the interlayer 320 that may be utilized with the SOT MTJ devices 300, 301 of FIGS. 3A-3B, according to various embodiments. As shown in FIGS. 4A-4D, the buffer layer 310 and the interlayer 320 may each individually comprise one or more amorphous or crystalline sublayers or intermediate layers 312, 314, 316, 318, and 326.

The embodiments of FIGS. 4A-4D can be used in combination with each other and are not an exclusive list of possible buffer layers 310 and/or interlayers 320. Moreover, while each of FIGS. 4A-4D describes both the buffer layer 310 and the interlayer 320, the buffer layer 310 and the interlayer 320 may have different configurations or a different amount of sublayers or intermediate layers 312, 314, 316, 318, and 326. Furthermore, the buffer layer 310 may be the single layer of a crystalline or amorphous material as discussed and shown above in FIGS. 3A-3B and the interlayer 320 may be a multilayer structure as described below in FIGS. 4A-4D, or vice versa.

In FIG. 4A, the buffer layer 310 and/or the interlayer 320 comprises a first intermediate layer 312 and a second intermediate layer 314 disposed on the first intermediate layer 312. In one embodiment, the first intermediate layer 312 comprises a metallic amorphous material and the second intermediate layer 314 comprises a tetragonal (001) or (110) material. In another embodiment, the first intermediate layer 312 comprises a metallic amorphous material and the second intermediate layer 314 comprises a textured (100) layer.

The tetragonal (001) or (110) material may have an a-axis in the range of about 4.49 Å to about 4.69 Å and a c-axis in the range of about 2.88 Å to about 3.15 Å. The tetragonal (001) or (110) material may have an a-axis lattice parameter in the range of about 4.20 Å to about 4.75 Å. The tetragonal (001) or (110) material may be selected from the group consisting of: $SbO_2$, $TiO_2$, $IrO_2$, $RuO_2$, $CrO_2$, $VO_2$, $OsO_2$, $RhO_2$, $PdO_2$, $WVO_4$, $CrNbO_4$, $SnO_2$, $GeO_2$, and composites thereof with one or more elements selected from the group consisting of: W, Ta, and Nb.

The amorphous metallic material may be selected from the group consisting of: NiTa, NiFeTa, NiNb, NiW, NiFeW, NiFeHf, CoHfB, CoZrTa, CoFeB, NiFeB, CoB, FeB, and alloy combinations thereof with one or more elements selected from the group consisting of: Ni, Fe, Co, Zr, W, Ta, Hf, Ag, Pt, Pd, Si, Ge, Mn, Al, and Ti.

The textured (100) layer may be selected from the group consisting of: (1) RuAl, (2) Cr incorporated according to several options: (2a) deposited at a temperature greater than or equal to 250° C., (2b) in heated CrX alloys where X=Ru, Mo, W, or Ti<10 at. %, or $CrMo_n$ where n is about 20 at. % to about 50 at. %, (2c) in a stack of heated (e.g., to less than or equal to about 200° C.) $Cr/CrMo_n$ or $CrMo_n/Cr/CrMo_n$.

In FIG. 4B, the buffer layer 310 and/or the interlayer 320 comprises a first intermediate layer 312, a second intermediate layer 314 disposed on the first intermediate layer 312, and a third intermediate layer 316 disposed on the second intermediate layer 314. The first intermediate layer 312 comprises a metallic amorphous material and the second intermediate layer 314 comprises a textured (100) layer. In one embodiment, the third intermediate layer 316 comprises a textured bcc (100) layer. In another embodiment, the third intermediate layer 316 comprises an fcc (100) layer. In yet another embodiment, the third intermediate layer 316 comprises a tetragonal (001) layer.

The bcc (100) material may selected from the group consisting of: V, Nb, Mo, W, Ta, $WTi_{50}$, $Al_{10}Nb_{40}Ti_{50}$, Cr, RuAl in a B2 phase, NiAl in a B2 phase, RhAl in a B2 phase, and alloy combinations thereof with one or more elements selected from the group consisting of: Ti, Al, Pd, Pt, Ni, Fe, and Cr.

The fcc (100) material may have a lattice parameter in the range of about 4.20 Å to about 4.70 Å. The fcc (100) material may be selected from the group consisting of oxides, carbides, and nitrides of: (1) FeO, CoO, NiO, ZrO, MgO, TiO, ScN, TiN, NbN, ZrN, HfN, TaN, ScC, TiC, NbC, ZrC, HfC, TaC, and WC; (2) zinc blend cubic fcc (100) materials selected from the group consisting of: CoO, SIC, GaN, FeN, and ZnO; (3) composite combinations of (1) and (2) thereof with one or more elements selected from the group of W, Al, and Si; and (4) fcc metals selected from the group consisting of: $MoZr_{10}$, $MoNi_{20}$, $NbZr_{20}$, and alloy combinations thereof with one or more elements selected from the group consisting of: W, Al, and Si. In other words, the fcc (100) is selected from the group consisting of: FeO, CoO, ZrO, MgO, TiO, ScN, TiN, NbN, ZrN, HfN, TaN, ScC, TiC, NbC, ZrC, HfC, TaC, WC, CoO, SIC, GaN, FeN, ZnO, $MoZr_{10}$, $MoNi_{20}$, $NbZr_{20}$, and composite combinations thereof with one or more elements selected from the group of: W, Al, and Si.

In FIG. 4C, the buffer layer 310 and/or the interlayer 320 comprises a first intermediate layer 312, a second intermediate layer 314 disposed on the first intermediate layer 312, a third intermediate layer 316 disposed on the second intermediate layer 314, and a fourth intermediate layer 318 disposed on the third intermediate layer 316. The first intermediate layer 312 comprises a metallic amorphous material and the second intermediate layer 314 comprises a textured (100) layer. In one embodiment, the third intermediate layer 316 comprises a textured bcc (100) layer and the fourth intermediate layer 318 comprises an fcc (100) layer.

In another embodiment, the third intermediate layer 316 comprises a textured (100) bcc material and the fourth intermediate layer 318 comprises a tetragonal (110) material. In yet another embodiment, the third intermediate layer 316 comprises a textured (100) bcc material and the fourth intermediate layer 318 comprises a tetragonal (001) material.

In FIG. 4D, the buffer layer 310 and/or the interlayer 320 comprises a first intermediate layer 312 that comprises a metallic amorphous material, a second intermediate layer 314 that comprises a textured (100) material, a third intermediate layer 316 that comprises a textured (100) bcc material, a fourth intermediate layer 318 that comprises a tetragonal (001) material, and a fifth intermediate layer 326 that comprises an fcc (100) material.

In certain embodiments, the buffer layer 310 and/or the interlayer 320 are deposited by physical vapor deposition (PVD), such as sputtering, molecular beam epitaxy, ion beam deposition, other suitable PVD processes, or combinations thereof. In certain embodiments, the buffer layer 310 and/or the interlayer 320 are deposited at ambient temperatures, such as from 20° C. to about 25° C. In one aspect, forming the buffer layer 310 and/or the interlayer 320 at ambient temperatures reduces thermal migration of the intermediary layers 312, 314, 316, 318, and 326. In another aspect, forming the buffer layer 310 at ambient temperatures minimizes altering the magnetization direction of magnetic materials formed on substrate 302 prior to forming the buffer layer 310.

In certain embodiments, a post etch of the buffer layer 310 and/or the interlayer 320 is conducted. For example, the buffer layer 310 and/or the interlayer 320 can be post etched by an ion etch, such as directing argon ions to etch the intermediary layer 312, 314, 316, 318, and 326 on which the BiSb layer 304 is disposed. It is believed that a post etch enhances the interface between the intermediary layer 312, 314, 316, 318, and 326 and the BiSb layer 304 by cleaning the surface of the intermediary layer 312, 314, 316, 318, and 326 and/or by distorting the intermediary layer 312, 314, 316, 318, and 326 to promote (012) growth of the BiSb layer 304 thereover.

By including a material that matches the BiSb (012) textured surface of the BiSb layer 304, such as at least one of a covalently bonded amorphous material, a tetragonal (001) material, a tetragonal (110) material, a body-centered cubic (bcc) (100) material, a face-centered cubic (fcc) (100) material (both rock salt and zinc blend), a textured bcc (100) material, a textured fcc (100) material, a textured (100) material, or an amorphous metallic material, in the buffer layer 310 and the interlayer 320 disposed in contact with the BiSb layer 304, a (012) growth of the BiSb layer 304 is promoted and surface roughness of the BiSb layer 304 is reduced by reducing the overall grain size of the Bi and Sb atoms of the BiSb layer 304. Improving or maintaining the BiSb (012) textured surface reduces chemical interactions with the BiSb layer 304, which inhibits Sb migration of the BiSb layer 304. Furthermore, including a material that matches the BiSb (012) textured surface of the BiSb layer 304 disposed in contact with the BiSb layer 304 improves epitaxy, reduces roughness, and enhances uniformity of the BiSb layer 304.

Figure 5:
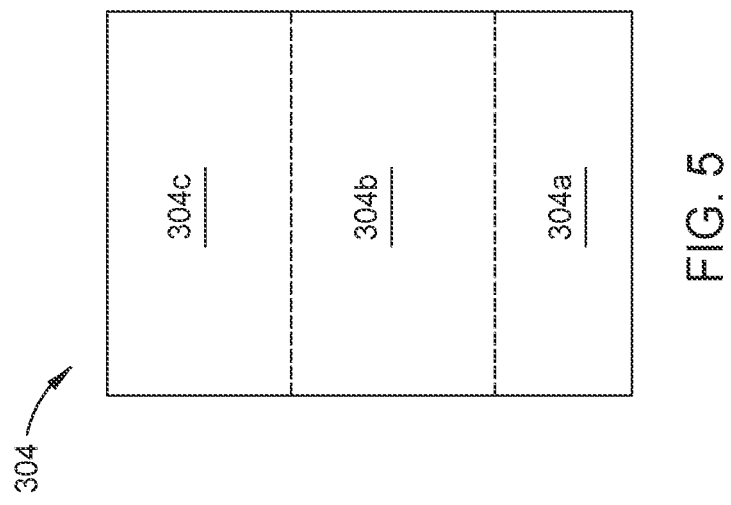
FIG. 5 is a schematic cross-sectional view of a BiSb layer comprising sublayers, which may be the BiSb layer of the SOT MTJ devices of FIGS. 3A-3B, according to one embodiment.

FIG. 5 is a schematic cross-sectional view of a BiSb layer stack 304 comprising sublayers, which may be the BiSb layer stack 304 of the SOT MTJ devices 300, 301 of FIGS. 3A-3B, according to one embodiment. The BiSb layer stack 304 comprises Bi laminates 304a, 304c. A first Bi laminate 304a is disposed on the buffer layer 310. A BiSb layer 304b is disposed on the first Bi laminate 304a. The BiSb layer 304b may comprise Sb in an atomic percentage of about 10% to about 20%. A second Bi laminate 304c is disposed on the BiSb layer 304b. In some embodiments, the first and second Bi laminates 304a, 304c each has a thickness of about 0 Å to about 10 Å.

The BiSb layer stack 304 has a (012) orientation. In some embodiments, the BiSb layer stack 304 comprises Bi1-xSbx wherein x is 0<x<1. In certain embodiments, the BiSb layer stack 304 comprises Bi1-xSbx wherein x is 0.05<x<0.22 or comprises antimony in an atomic percent content from about 7% to about 22%. The BiSb layer stack 304 has a thickness of about 20 Å to about 200 Å, such as about 50 Å to about 150 Å.

TABLE 1 shows one example of the properties of a BiSb layer stack 304 with a (012) orientation in comparison to beta-tantalum and a BiSb layer with a (001) orientation.

TABLE 1

|  | Spin Hall angle $\theta_{SH}$ | conductivity $\sigma$ ($10^6$ $\Omega^{-1}m^{-1}$) | Power (relative) |
| --- | --- | --- | --- |
| Beta-Ta | −0.15 | 0.52 | 1 |
| BiSb (001) | 11 | 0.25 | $3.9 \times 10^{-04}$ |
| BiSb (012) | 52 | 0.25 | $1.7 \times 10^{-05}$ |

A BiSb layer stack 304 with a (012) orientation has similar electrical conductivity to the beta-tantalum (Beta-Ta) and a much larger spin Hall angle than Beta-Ta or a BiSb layer with a (001) orientation. Therefore, the relative power to produce a spin Hall effect is lower for BiSb (012) in comparison to Beta-Ta or BiSb (001).

FIGS. 6A-6E are schematic views illustrating atom lattice structures of layers within the SOT MTJ devices 300, 301 of FIGS. 3A-3B, according to various embodiments. The various atoms in each of FIG. 6A-6E are represented by dots.

As shown in FIG. 6A, a BiSb layer 304 or a BiSb layer stack 304 with a (012) orientation has a rectangular surface with dimensions of a=about 4.54 Å and b=about 4.75 Å with about 3% mismatch in one direction. Even though the crystalline lattice structure of the BiSb layer or layer stack 304 is rectangular, it can be approximated as a square lattice were a=4.64 Å. When the buffer layer 310 and/or the interlayer 320 are made of material with a lattice structure or a nearest neighbor distance near 4.64 Å, the buffer layer 310 material and/or the interlayer 320 material can also be used to promote the growth of BiSb in a (012) orientation.

FIG. 6B illustrates a comparison of the crystalline configuration of fcc and bcc lattice structures. The filled dots represent bcc atoms and the open dots represent fcc atoms. As shown in FIG. 6B, the $a_{fcc}$ is equal to $a_{bcc}\sqrt{2}$. Thus, both the crystalline configurations of fcc and bcc lattice structures can be approximated as square lattices.

FIG. 6C is an exemplary orthogonal view illustrating the tetragonal structure of $RuO_2$ in a (001) orientation, where the filled in dots represent Ru and the open dots represent O. $RuO_2$ is one example of a tetragonal crystal lattice structure in a (001) orientation that may be utilized in the buffer layer 310 and/or the interlayer 320. However, one skilled in the art would know that other chemicals with a tetragonal (001) orientation may be utilized instead, and the tetragonal (001) orientation is not intended to be limited to $RuO_2$. For $RuO_2$, the rectangular prismatic dimensions are a=4.50 Å, b=4.50

Å, and c=3.10 Å. Therefore, RuO$_2$ has a 2D square lattice structure where a=4.50 Å. Compared to the crystal lattice structure of BiSb, where a=4.64 Å, there is a 3% difference. Therefore, RuO$_2$ with an (001) orientation can be utilized to grow BiSb in a (012) texture.

Figure 6E:
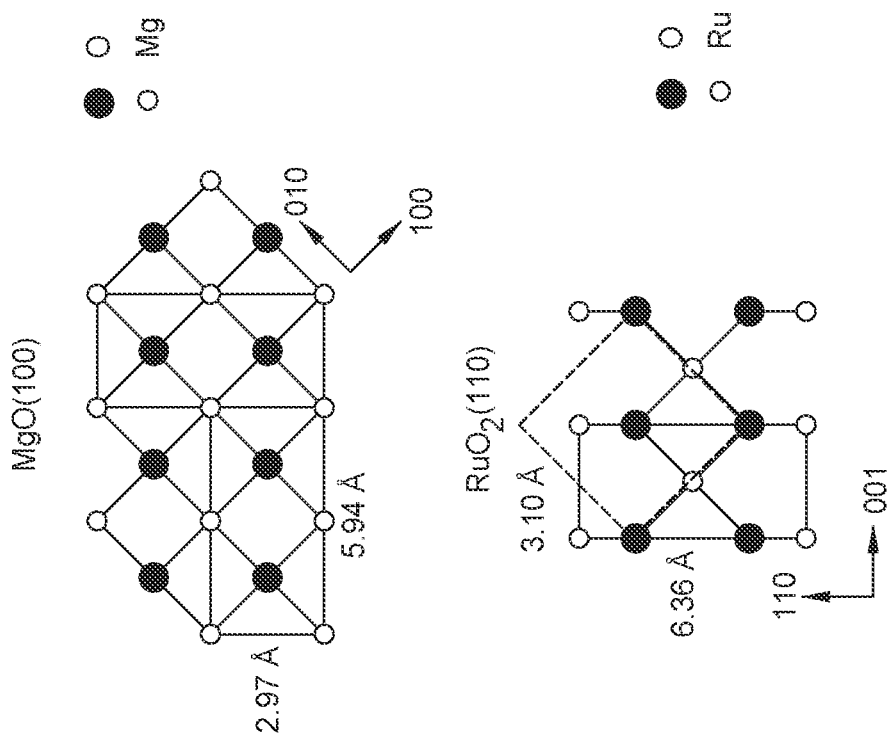
Figure 6D:
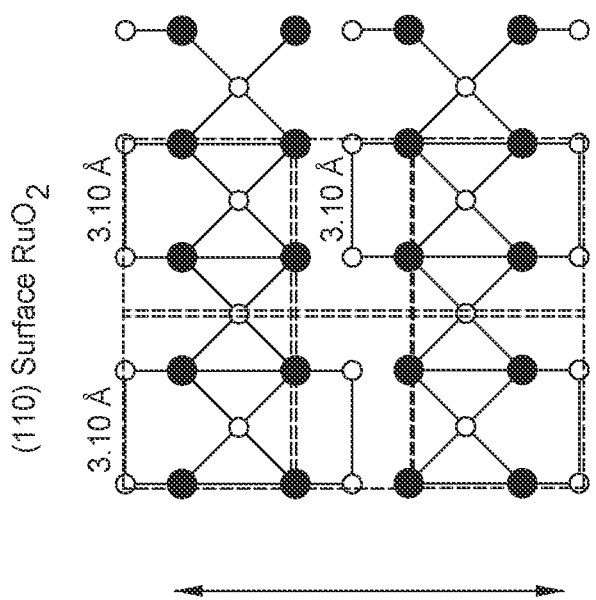

FIG. 6D is a schematic plan view illustrating the tetragonal structure of RuO$_2$ in a (110) orientation. FIG. 6E illustrates a comparison of the crystalline configuration of MgO in an fcc (100) orientation and RuO$_2$ in a tetragonal (110) orientation. For RuO$_2$ with a (110) orientation, RuO$_2$ has a crystal lattice structure where a=6.36 Å and b=3.10 Å. As seen in the dashed square in FIG. 6D, there is a larger mismatch between BiSb and RuO$_2$ in a tetragonal (110) orientation due to the Ru—Ru and Ru—O bond length differences. There is a 37% mismatch between the BiSb a value and the RuO$_2$ a value, and a 33% mismatch between the BiSb a value and the RuO$_2$ b value. However, as seen in FIGS. 6D-6E, the distances between the oxygen atoms (represented by the open dots) matches with BiSb in a (012) orientation.

Figure 7:
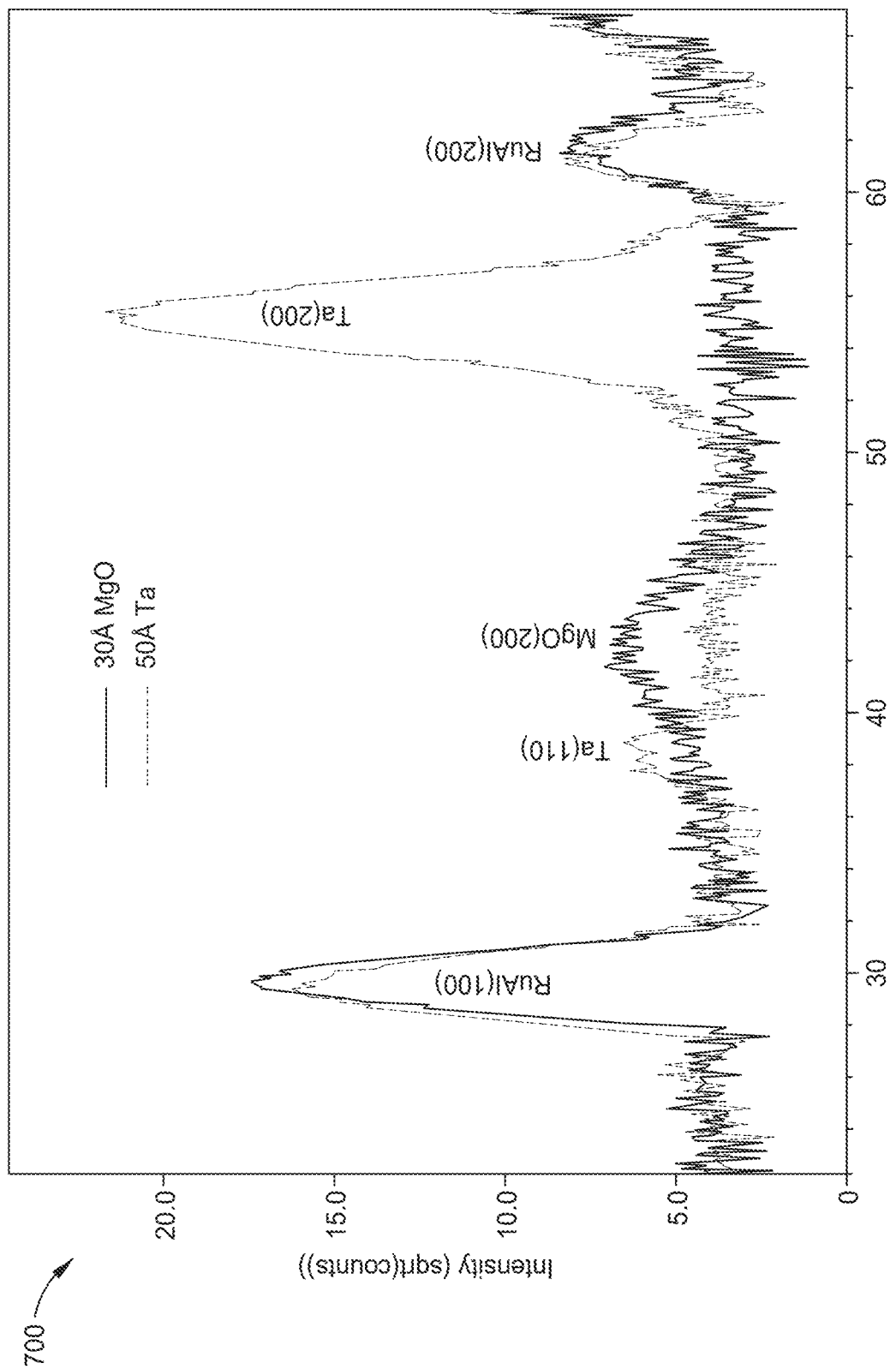
Figure 8:
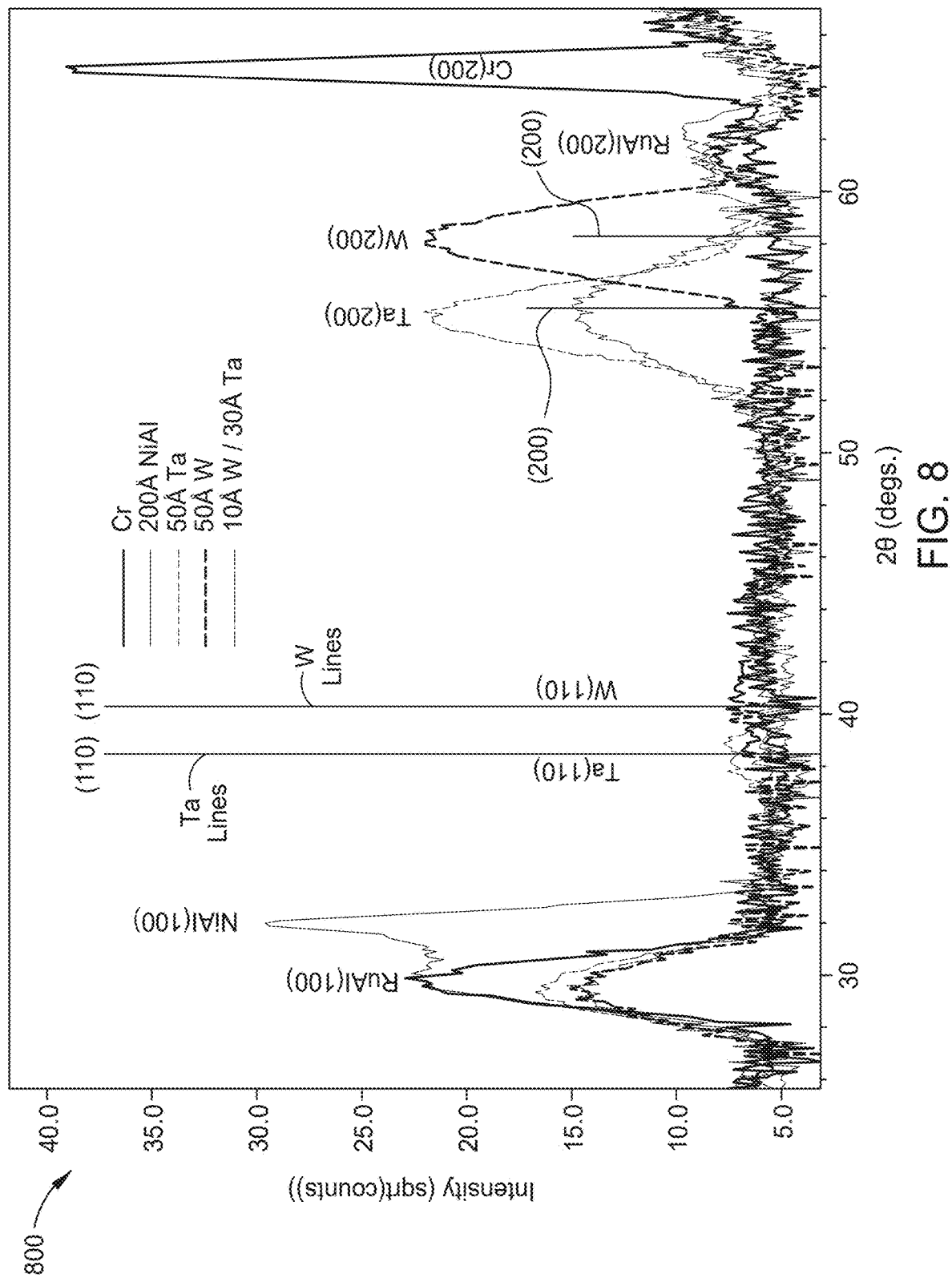

FIGS. 7 and 8 are graphs 700, 800 of a textured layer of about 30 Å of RuAl in a B2 phase that is disposed on an amorphous layer of about 30 Å of NiFeTa. In FIG. 7, the graph 700 shows that this layering configuration with a close lattice match results in a uniform crystalline lattice structure. A tenuous lattice match results in some of the material forming a crystal lattice structure that is different from the bulk of the material. In FIG. 7, either MgO or Ta is disposed on the RuAl layer. RuAl in the B2 phase has an $a_{bcc}$ of 3.000 Å, and Ta has an $a_{bcc}$ of 3.306 Å, which is more than a 10% difference in value. Due to this poor lattice match, some of the Ta forms in a (110) orientation and the rest forms in a (200) orientation. In contrast, the a√2 value for RuAl in the B2 phase is 4.243 Å and the $a_{fcc}$ of MgO is 4.210 Å. Since these values are close, the majority of the MgO forms in a (100) orientation.

Other fcc materials similar to MgO have conductive properties. Therefore, the fcc materials will reduce the shunting, improve the epitaxy, and improve the growth of the BiSb. A number of the tetragonal oxides are also conductive with high resistivities, contributing the similar improved growth properties as the fcc materials.

In FIG. 8, the graph 800 shows that layering of the materials to have a closer lattice structure results in a more uniform crystalline lattice structure growth for the BiSb layer or layer stack 304. In FIG. 8, 10 Å of W is layered on the RuAl layer, and 30 Å of Ta is layered on the W layer. RuAl in the B2 phase has an $a_{bcc}$ of 3.000 Å, W has an $a_{bcc}$ of 3.165 Å, and Ta has an $a_{bcc}$ of 3.306 Å. Since the difference in $a_{bcc}$ between each layer is less than 10%, the crystalline lattice structure is more uniform than the lattice structure formed with more than a 10% difference. The Ta (100) texture is improved by using W as a strain buffer layer. Other B2 materials with lattices close to RuAl can also be grown with a (100) texture (like NiAl, for example).

FIG. 9A is a schematic cross-sectional view of a SOT device 900 for use in a MAMR write head, such as the MAMR write head of the drive 100 of FIG. 1 or other suitable magnetic media drives. The SOT device 900 comprises a BiSb layer 304 with a (012) orientation formed over a buffer layer 310 formed over a substrate 302, such as the BiSb layer 304 and the buffer layer 310 of FIGS. 3A-5. A spin torque layer (STL) 970 is formed over the BiSb layer 304. The STL 970 comprises a ferromagnetic material such as one or more layers of CoFe, CoIr, NiFe, and CoFeX alloy wherein X=B, Ta, Re, or Ir.

In certain embodiments, an electrical current shunt block layer 960 is disposed between the BiSb layer 304 and the STL 970. The electrical current shunt blocking layer 960 reduces electrical current from flowing from the BiSb layer 304 to the STL 970 but allows spin orbital coupling of the BiSb layer 304 and the STL 970. In certain embodiments, the electrical current shunt blocking layer 960 comprises a magnetic material which provides greater spin orbital coupling between the BiSb layer 304 and the STL 970 than a non-magnetic material. In certain embodiments, the electrical current shunt blocking layer 960 comprises a magnetic material of FeCo, FeCoM, FeCoMO, FeCoMMeO, FeCoM/MeO stack, FeCoMNiMnMgZnFeO, FeCoM/NiMnMgZn-FeO stack, multiple layers/stacks thereof, or combinations thereof in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr. In certain embodiments, the electrical current shunt blocking layer 960 is formed to a thickness from about 10 Å to about 100 Å. In certain aspects, an electrical current shunt blocking layer 960 having a thickness of over 100 Å may reduce spin orbital coupling of the BiSb layer 304 and the STL 970. In certain aspects, an electrical current shunt blocking layer having a thickness of less than 10 Å may not sufficiently reduce electrical current from BiSb layer 304 to the STL 970.

In certain embodiments, additional layers are formed over the STL 970 such as a spacer layer 980 and a pinning layer 990. The pinning layer 990 can partially pin the STL 970. The pinning layer 990 comprises a single or multiple layers of PtMn, NiMn, IrMn, IrMnCr, CrMnPt, FeMn, other antiferromagnetic materials, or combinations thereof. The spacer layer 980 comprises single or multiple layers of magnesium oxide, aluminum oxide, other non-magnetic materials, or combinations thereof.

Figure 9C:
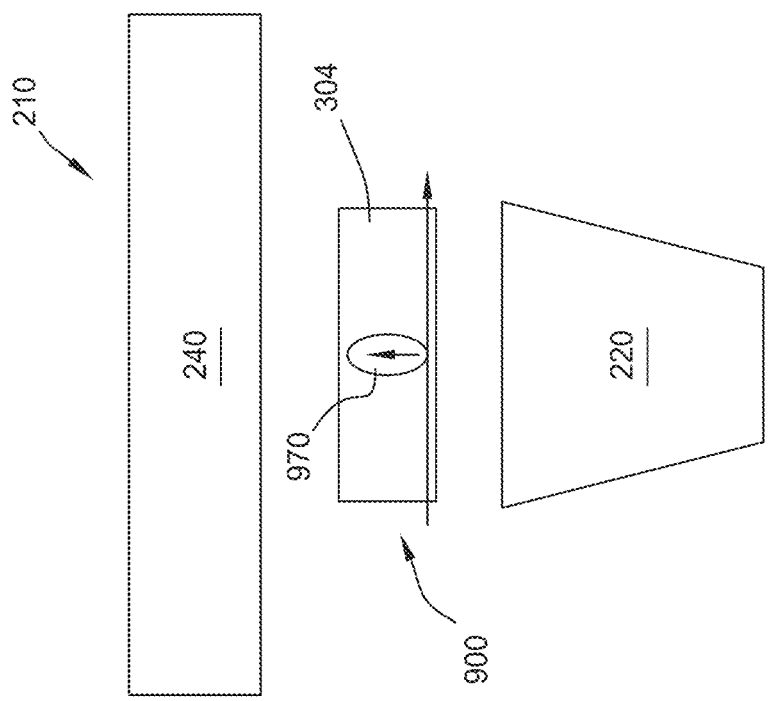
FIGS. 9B-9C are schematic MFS views of certain embodiments of a portion of a MAMR write head with a SOT device of FIG. 9A.
Figure 9B:
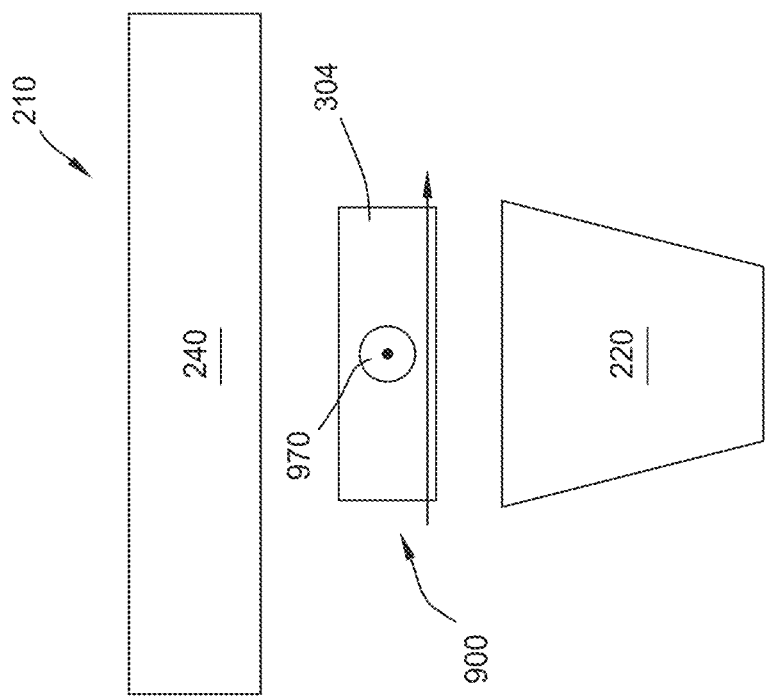
Figure 11:
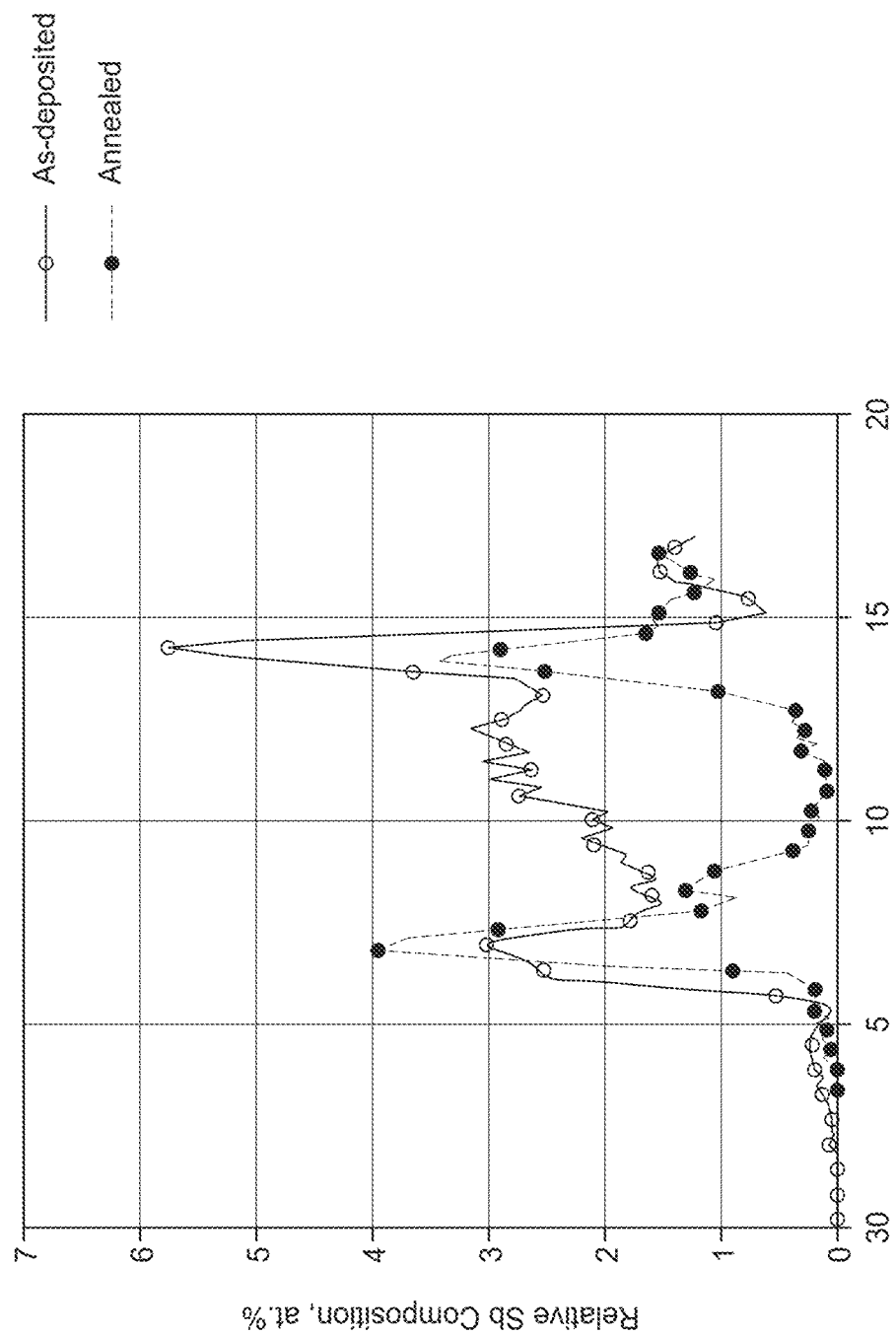
FIG. 11 shows the problem of Sb migration to the interfaces from the bulk BiSb layer, according to one embodiment.

FIGS. 9B-9C are schematic MFS views of certain embodiments of a portion of a MAMR write head 210 with a SOT device 900 of FIG. 9A. The MAMR write head 210 can be the write head FIG. 2 or other suitable write heads in the drive 100 of FIG. 1 or other suitable magnetic media drives such as tape drives. The MAMR write head 210 includes a main pole 220 and a trailing shield 240 in a track direction. The SOT device 900 is disposed in a gap between the main pole and the trailing shield 240.

During operation, charge current through a BiSb layer or layer stack 304 acting as a spin Hall layer generates a spin current in the BiSb layer. The spin orbital coupling of the BiSb layer and a spin torque layer (STL) 970 causes switching or precession of magnetization of the STL 970 by the spin orbital coupling of the spin current from the BiSb layer 304. Switching or precession of the magnetization of the STL 970 can generate an assisting AC field to the write field. Energy assisted write heads based on SOT have multiple times greater power efficiency in comparison to MAMR write heads based on spin transfer torque. As shown in FIG. 9B, an easy axis of a magnetization direction of the STL 970 is perpendicular to the MFS from shape anisotropy of the STL 970, from the pinning layer 990 of FIG. 9A, and/or from hard bias elements proximate the STL 970. As shown in FIG. 9C, an easy axis of a magnetization direction of the STL 970 is parallel to the MFS from shape anisotropy of the STL 970, from the pinning layer 990 of FIG. 9A, and/or from hard bias elements proximate the STL 970.

FIG. 10 is a schematic cross-sectional view of a SOT MTJ 1001 used as a MRAM device 1000. The MRAM device 1000 comprises a reference layer (RL) 1010, a spacer layer 1020 over the RL 1010, a recording layer 1030 over the spacer layer 1020, a buffer layer 310 over an electrical current shunt block layer 1040 over the recording layer 1030, and a BiSb layer or layer stack 304 over the buffer layer 310. The BiSb layer 304 and the buffer layer 310 may be the BiSb layer 304 and the buffer layer 310 of FIGS. 3A-5.

The RL 1010 comprises single or multiple layers of CoFe, other ferromagnetic materials, and combinations thereof. The spacer layer 1020 comprises single or multiple layers of magnesium oxide, aluminum oxide, other dielectric materials, or combinations thereof. The recording layer 1030 comprises single or multiple layers of CoFe, NiFe, other ferromagnetic materials, or combinations thereof.

As noted above, in certain embodiments, the electrical current shunt block layer 1040 is disposed between the buffer layer 310 and the recording layer 1030. The electrical current shunt blocking layer 1040 reduces electrical current from flowing from the BiSb layer 304 to the recording layer 1030 but allows spin orbital coupling of the BiSb layer 304 and the recording layer 1030. For example, writing to the MRAM device can be enabled by the spin orbital coupling of the BiSb layer and the recording layer 1030, which enables switching of magnetization of the recording layer 1030 by the spin orbital coupling of the spin current from the BiSb layer 304. In certain embodiments, the electrical current shunt blocking layer 1040 comprises a magnetic material which provides greater spin orbital coupling between the BiSb layer 304 and the recording layer 1030 than a non-magnetic material. In certain embodiments, the electrical current shunt blocking layer 1040 comprises a magnetic material of FeCoM, FeCoMO, FeCoMMeO, FeCoM/MeO stack, FeCoMNiMnMgZnFeO, FeCoM/NiMnMgZnFeO stack, multiple layers/stacks thereof, or combinations thereof, in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr.

The MRAM device 1000 of FIG. 10 may include other layers, such as pinning layers, pinning structures (e.g., a synthetic antiferromagnetic (SAF) pinned structure), electrodes, gates, and other structures. Other MRAM devices besides the structure of FIG. 10 can be formed utilizing a BiSb layer 304 with a (012) orientation over a buffer layer 310 to form a SOT MTJ 1001.

By including a material that matches the BiSb (012) textured surface of the BiSb layer, such as at least one of a covalently bonded amorphous material, a tetragonal (001) material, a tetragonal (110) material, a body-centered cubic (bcc) (100) material, a face-centered cubic (fcc) (100) material, a textured bcc (100) material, a textured fcc (100) material, a textured (100) material, or an amorphous metallic material, in the buffer layer and the interlayers disposed in contact with the BiSb layer, a (012) growth of the BiSb layer is promoted and surface roughness of the BiSb layer is reduced by reducing the overall grain size of the Bi and Sb atoms of the BiSb layer. Improving or maintaining the BiSb (012) textured surface reduces chemical interactions with the BiSb layer, which inhibits Sb migration of the BiSb layer. Furthermore, including a material that matches the BiSb (012) textured surface of the BiSb layer disposed in contact with the BiSb layer improves epitaxy, reduces roughness, and enhances uniformity of the BiSb layer.

In one embodiment, a spin-orbit torque (SOT) magnetic tunnel junction (MTJ) device comprises a substrate, a buffer layer formed over the substrate, the buffer layer comprising: an amorphous layer comprising a material in an amorphous structure, wherein the material comprises a covalently bonded carbide, a covalently bonded oxide, or a covalently bonded nitride, and a bismuth antimony (BiSb) layer formed over the buffer layer, the BiSb layer having a (012) orientation, wherein the buffer layer is configured to reduce migration of Sb in the BiSb layer.

The buffer layer further comprises one or more sublayers, each of the one or more sublayers comprising one or more materials selected from the group consisting of: a tetragonal (001) material, a tetragonal (110) material, a body-centered cubic (bcc) (100) material, a face-centered cubic (fcc) (100) material, a textured bcc (100) material, a textured fcc (100) material, a textured (100) material, an amorphous metallic material, and a layered combination of one or more of any of the preceding materials. At least one sublayer of the one or more sublayers comprises the bcc (100) material, the bcc (100) material being selected from the group consisting of: V, Nb, Mo, W, Ta, WTi$_{50}$, Al$_{10}$Nb$_{40}$Ti$_{50}$, Cr, CrMo, CrX where X=Ti, W, Mo, Ru, or RuAl in a B2 phase, and alloy combinations thereof with elements selected from the group consisting of: Ti, Al, Pd, Pt, Ni, Fe, and Cr. At least one sublayer of the one or more sublayers comprises the fcc (100) material, the fcc (100) material being selected from the group consisting of: FeO, CoO, ZrO, MgO, TiO, ScN, TiN, NbN, ZrN, HfN, TaN, ScC, TiC, NbC, ZrC, HfC, TaC, WC, CoO, SIC, GaN, FeN, ZnO, MoZr$_{10}$, MoNi$_{20}$, NbZr$_{20}$, and composite combinations thereof with one or more elements selected from the group of: W, Al, and Si.

At least one sublayer of the one or more sublayers comprises the tetragonal (001) or (110) material, the tetragonal (001) or (110) material being selected from the group consisting of: SbO$_2$, TiO$_2$, IrO$_2$, RuO$_2$, CrO$_2$, VO$_2$, OsO$_2$, RhO$_2$, PdO$_2$, WVO$_4$, CrNbO$_4$, SnO$_2$, GeO$_2$, composites thereof, and with elements selected from the group consisting of: W, Ta and Nb. The tetragonal (001) or (110) material has an a-axis in the range of about 4.49 Å to about 4.69 Å and a c-axis in the range of about 2.88 Å to about 3.15 Å. At least one sublayer of the one or more sublayers comprises the amorphous metallic material, the amorphous metallic material being selected from the group consisting of: NiTa, NiFeTa, NiNb, NiW, NiFeW, NiFeHf, CoHfB, CoZrTa, CoFeB, NiFeB, CoB, FeB, and alloy combinations thereof with elements selected from the group consisting of: Ni, Fe, Co, Zr, W, Ta, Hf, Ag, Pt, Pd, Si, Ge, Mn, Al, and Ti.

The material in the amorphous structure has a nearest neighbor XRD diffraction peak with d-spacing equal to about 2.0 Å to about 2.2 Å, corresponding to a (111) d-spacing from a$_{fcc}$ crystal structure where a$_{fcc}$ is between about 3.5 Å and 3.8 Å. The SOT MTJ device further comprises an interlayer disposed on the BiSb layer, the interlayer comprising one or more materials selected from the group consisting of: a tetragonal (001) material, a tetragonal (110) material, a body-centered cubic (bcc) (100) material, a face-centered cubic (fcc) (100) material, a textured bcc (100) material, a textured fcc (100) material, a textured (100) material, an amorphous material comprising covalently bonded carbide, oxide, or nitride, an amorphous metallic material, and a layered combination of one or more of any of the preceding materials.

In another embodiment, a SOT MTJ device comprises a substrate, a buffer layer formed on the substrate, the buffer layer comprising: at least one first intermediary layer, the at least one first intermediary layer comprising at least one of: a tetragonal (001) material, a tetragonal (110) material, a body-centered cubic (bcc) (100) material, a face-centered cubic (fcc) (100) material, a textured bcc (100) material, a textured fcc (100) material, a textured (100) material, or an amorphous material comprising a covalently bonded carbide, a covalently bonded oxide, or a covalently bonded nitride, and a bismuth antimony (BiSb) layer stack formed over the buffer layer comprising a BiSb layer having a (012) orientation, wherein the BiSb layer stack further comprises: a first Bi layer, wherein the BiSb layer is disposed on the first Bi layer, and a second Bi layer disposed on the BiSb layer, wherein the first and second Bi layers: each has a thickness greater than about 0 Å and less than about 10 Å, and sandwich the BiSb layer to promote a (012) BiSb texture and serve as Sb composition modulations layers configured to improve a chemical uniformity and structure of the BiSb layer degraded by Sb migration.

The buffer layer further comprises an amorphous layer disposed below the first intermediary layer, the amorphous layer comprising a material selected from the group consisting of: NiTa, NiFeTa, NiNb, NiW, NiFeW, NiFeHf, CoHfB, CoZrTa, CoFeB, NiFeB, CoB, FeB, and alloy combinations thereof with elements selected from the group consisting of: Ni, Fe, Co, Zr, W, Ta, Hf, Ag, Pt, Pd, Si, Ge, Mn, Al, and Ti. The buffer layer further comprises at least one second intermediary layer. The at least one second intermediary layer is a textured bcc (100) material. The at least one second intermediary layer is a textured fcc (100) material. The SOT MTJ device further comprises an interlayer disposed on the BiSb layer, the interlayer comprising a same material as the at least one first intermediary layer. The first and second Bi layers each has a width of about 0 Å to about 10 Å. The at least one first intermediary layer comprises the tetragonal (001) or (110) material, the tetragonal (001) or (110) material having an a-axis lattice parameter in the range of about 4.18 Å to about 4.75 Å. The at least one first intermediary layer comprises the fcc (100) material, the fcc (100) material having a lattice parameter in the range of about 4.18 Å to about 4.75 Å.

In yet another embodiment, a SOT MTJ device comprises a substrate and a buffer layer formed over the substrate, the buffer layer comprising: a textured layer with a (100) orientation and a first intermediary layer disposed over the textured layer, the first intermediary layer comprising at least one of a cubic crystal structure selected from the group consisting of tetragonal (001), tetragonal (110), body-centered cubic (bcc) (100), face-centered cubic (fcc) (100), textured bcc (100), and textured fcc (100). The SOT MTJ device further comprises a bismuth antimony (BiSb) layer formed over the buffer layer, the BiSb layer having a (012) orientation, wherein the buffer layer is configured to reduce diffusion of Sb in the BiSb layer, and an interlayer disposed on the BiSb layer.

The buffer layer further comprises an amorphous layer comprising a material selected from the group consisting of: NiTa, NiFeTa, NiNb, NiW, NiFeW, NiFeHf, CoHfB, CoZrTa, CoFeB, NiFeB, CoB, FeB, and alloy combinations thereof with elements selected from the group consisting of: Ni, Fe, Co, Zr, W, Ta, Hf, Ag, Pt, Pd, Si, Ge, Mn, Al, and Ti. The amorphous layer is disposed over the substrate, the textured layer is disposed on the amorphous layer, the first intermediary layer is disposed on the textured layer, and the BiSb layer is disposed on the first intermediary layer. The buffer layer further comprises one or more second intermediary layers, the one or more second intermediary layers having a cubic crystal structure different than the first intermediary layer.

The interlayer comprises one or more materials selected from the group consisting of: a tetragonal (001) material, a tetragonal (110) material, a body-centered cubic (bcc) (100) material, a face-centered cubic (fcc) (100) material, a textured bcc (100) material, a textured fcc (100) material, a textured (100) material, an amorphous material comprising a covalently bonded carbide, a covalently bonded oxide, or a covalently bonded nitride, an amorphous metallic material, and a layered combination of one or more of any of the preceding materials. The textured layer is selected from the group consisting of: RuAl and Cr deposited at a temperature of about 250° C. or greater, Cr in heated CrX alloys where X=Ru, Mo, W, or Ti in less than about 10 atomic percent, the CrX alloys being heated to a temperature less than or equal to about 200° C., as $CrMo_n$ where n is about 20 atomic percent to about 50 atomic percent, or in a sandwich of heated $Cr/CrMo_n$ or $CrMo_n/Cr/CrMo_n$ where n is about 20 atomic percent to about 50 atomic percent.

While the foregoing is directed to embodiments of the present disclosure, other and further embodiments of the disclosure may be devised without departing from the basic scope thereof, and the scope thereof is determined by the claims that follow.

What is claimed is:

1. A spin-orbit torque (SOT) device, comprising:
a substrate;
a bismuth antimony (BiSb) layer disposed over the substrate, the BiSb layer having a (012) orientation; and
a multilayer structure disposed in contact with the BiSb layer, the multilayer structure comprising:
an amorphous sublayer comprising a material in an amorphous structure, wherein the material comprises a carbide, a oxide, or a nitride, and wherein the material in the amorphous sublayer has a lattice constant of a crystal structure ($a_{fcc}$) between about 3.5 Å and 3.71 Å.

2. The SOT device of claim 1, wherein the multilayer structure further comprises one or more sublayers in addition to the amorphous sublayer, each of the one or more sublayers comprising one or more materials selected from the group consisting of: a tetragonal (001) material, a tetragonal (110) material, a body-centered cubic (bcc) (100) material, a face-centered cubic (fcc) (100) material, a textured bcc (100) material, a textured fcc (100) material, a textured (100) material, an amorphous metallic material, and a layered combination of one or more of any of the preceding materials.

3. The SOT device of claim 1, wherein the multilayer structure is a buffer layer or an interlayer.

4. The SOT device of claim 1, wherein the material of the amorphous sublayer of the multilayer structure has a nearest neighbor distance equal to about $a_{fcc}$ divided by the square root of 3.

5. The SOT device of claim 1, wherein a nearest neighbor distance of the material of the amorphous sublayer of the multilayer structure is about 2.0 Å to about 2.2 Å.

6. The SOT device of claim 1, wherein the amorphous sublayer comprises one or more materials selected from the group consisting of: ScC, TiC, NbC, ZrC, HfC, TaC, FeO, CoO, ZrO, MgO, TiO, TiN, NbN, ZrN, HfN, and TaN.

7. A magnetic recording head comprising the SOT device of claim 1.

8. A magnetic recording device comprising the magnetic recording head of claim 7.

9. A magneto-resistive memory comprising the SOT device of claim 1.

10. A spin-orbit torque (SOT) device, comprising:
a substrate;
a multilayer structure disposed over the substrate, the multilayer structure comprising:
at least one first intermediary layer, the at least one first intermediary layer comprising at least one of: a tetragonal (001) material, a tetragonal (110) material, a body-centered cubic (bcc) (100) material, a face-centered cubic (fcc) (100) material, a textured bcc (100) material, a textured fcc (100) material, a textured (100) material, and an amorphous material comprising a carbide, an oxide, or a nitride; and a bismuth antimony (BiSb) layer stack disposed in contact with the multilayer structure, the bismuth antimony (BiSb) layer stack comprising:
a BiSb layer having a (012) orientation,
a first Bi layer, wherein the BiSb layer is disposed on the first Bi layer, and
a second Bi layer disposed on the BiSb layer,
wherein the first and second Bi layers sandwich the BiSb layer.

11. The SOT device of claim 10, wherein the first and second Bi layers each has a thickness greater than about 0.1 Å and less than about 10 Å.

12. The SOT device of claim 10, wherein the multilayer structure further comprises an amorphous layer disposed below the first intermediary layer, the amorphous layer comprising a material selected from the group consisting of: NiTa, NiFeTa, NiNb, NiW, NiFeW, NiFeHf, CoHfB, CoZrTa, CoFeB, NiFeB, CoB, FeB, and alloy combinations thereof with elements selected from the group consisting of: Ni, Fe, Co, Zr, W, Ta, Hf, Ag, Pt, Pd, Si, Ge, Mn, Al, and Ti.

13. The SOT device of claim 10, wherein the multilayer structure further comprises at least one second intermediary layer comprising a textured bcc (100) material or a textured fcc (100) material.

14. The SOT device of claim 10, wherein the multilayer structure is a buffer layer or an interlayer.

15. A magnetic recording head comprising the SOT device of claim 10.

16. A magnetic recording device comprising the magnetic recording head of claim 15.

17. A magneto-resistive memory comprising the SOT device of claim 10.

18. A spin-orbit torque (SOT) device, comprising:
a substrate;
a multilayer structure disposed over the substrate, the multilayer structure comprising:
a textured layer with a (100) orientation; and
a first intermediary layer disposed over the textured layer, the first intermediary layer comprising at least one of: a tetragonal (001) material, a tetragonal (110) material, a body-centered cubic (bcc) (100) material, a face-centered cubic (fcc) (100) material, a textured bcc (100) material, a textured fcc (100) material, a textured (100) material, and an amorphous material comprising a carbide, an oxide, or a nitride; and
a bismuth antimony (BiSb) layer disposed in contact with the multilayer structure, the BiSb layer having a (012) orientation.

19. The SOT device of claim 18, wherein the multilayer structure further comprises an amorphous layer comprising a material selected from the group consisting of: NiTa, NiFeTa, NiNb, NiW, NiFeW, NiFeHf, CoHfB, CoZrTa, CoFeB, NiFeB, CoB, FeB, and alloy combinations thereof with elements selected from the group consisting of: Ni, Fe, Co, Zr, W, Ta, Hf, Ag, Pt, Pd, Si, Ge, Mn, Al, and Ti, wherein the amorphous layer is disposed over the substrate, the textured layer is disposed on the amorphous layer, the first intermediary layer is disposed on the textured layer, and the BiSb layer is disposed on the first intermediary layer.

20. The SOT device of claim 18, wherein the textured layer comprises a material selected from the group consisting of:
(A) RuAl,
(B) Cr,
(C) CrX alloys where X is Ru, Mo, W, or Ti in less than about 10 atomic percent,
(D) CrMo$_n$ where n is about 20 atomic percent to about 50 atomic percent,
(E) a layered stack of Cr and CrMo$_n$ where n is about 20 atomic percent to about 50 atomic percent, or
(F) a layered stack of CrMo$_n$, Cr, and CrMo$_n$ where n is about 20 atomic percent to about 50 atomic percent.

21. The SOT device of claim 18, wherein the multilayer structure further comprises one or more second intermediary layers, the one or more second intermediary layers having a cubic crystal structure different than the first intermediary layer.

22. A magnetic recording head comprising the SOT device of claim 18.

23. A magnetic recording device comprising the magnetic recording head of claim 22.

24. A magneto-resistive memory comprising the SOT device of claim 18.

* * * * *